United States Patent
Nobbe

(10) Patent No.: US 11,601,098 B2
(45) Date of Patent: Mar. 7, 2023

(54) DIFFERENTIAL CASCODE AMPLIFIER ARRANGEMENT WITH REDUCED COMMON MODE GATE RF VOLTAGE

(71) Applicant: pSemi Corporation, San Diego, CA (US)

(72) Inventor: Dan William Nobbe, Crystal Lake, IL (US)

(73) Assignee: pSemi Corporation, San Diego, CA (US)

( * ) Notice: Subject to any disclaimer, the term of this patent is extended or adjusted under 35 U.S.C. 154(b) by 46 days.

(21) Appl. No.: 17/214,712

(22) Filed: Mar. 26, 2021

(65) Prior Publication Data

US 2022/0311390 A1 Sep. 29, 2022

(51) Int. Cl.
*H03F 1/22* (2006.01)
*H03F 3/45* (2006.01)
*H03F 1/32* (2006.01)

(52) U.S. Cl.
CPC ....... *H03F 1/3211* (2013.01); *H03F 3/45179* (2013.01); *H03F 1/223* (2013.01); *H03F 2200/372* (2013.01)

(58) Field of Classification Search
CPC .............. H03F 1/3211; H03F 3/45179; H03F 2200/372; H03F 3/45; H03F 3/45183; H03F 3/45192; H03F 3/45089; H03F 1/22; H03F 1/223; H03F 2200/294
USPC .................................................. 330/253, 311
See application file for complete search history.

(56) References Cited

U.S. PATENT DOCUMENTS

| | | | |
|---|---|---|---|
| 6,515,547 B2* | 2/2003 | Sowlati | H03F 1/223 330/277 |
| 8,228,125 B2* | 7/2012 | Heijden | H03F 1/0266 330/311 |
| 8,994,451 B1* | 3/2015 | Wyse | H03F 1/14 330/252 |
| 9,219,445 B2* | 12/2015 | Nobbe | H03F 1/0205 |
| 9,369,100 B2* | 6/2016 | Tatsumi | H03F 3/605 |
| 9,948,252 B1 | 4/2018 | Adamski | |
| 11,005,424 B2* | 5/2021 | Krishnamurthi | H03F 3/68 |
| 2003/0001674 A1 | 1/2003 | Nagaraj | |
| 2007/0222515 A1 | 9/2007 | Koutani et al. | |

(Continued)

OTHER PUBLICATIONS

Chang, Y., et al. "A Ka-Band Stacked Power Amplifier with 24.8-dBm Output Power and 24.3% PAE in 65-nm CMOS Technology," 2019 IEEE MTT-S International Microwave Symposium (IMS), Boston, MA, USA, 2019, pp. 316-319.

(Continued)

*Primary Examiner* — Khanh V Nguyen
(74) *Attorney, Agent, or Firm* — Steinfl + Bruno LLP

(57) ABSTRACT

Methods and devices for reducing gate node instability of a differential cascode amplifier are presented. Ground return loops, and therefore corresponding parasitic inductances, are eliminated by using voltage symmetry at nodes of two cascode amplification legs of the differential cascode amplifier. Series connected capacitors are coupled between gate nodes of pairs of cascode amplifiers of the two cascode amplification legs so to create a common node connecting the two capacitors. In order to reduce peak to peak voltage variation at the common node under large signal conditions, a shunting capacitor is connected to the common node.

21 Claims, 18 Drawing Sheets

(56) References Cited

U.S. PATENT DOCUMENTS

| | | | |
|---|---|---|---|
| 2008/0186100 A1* | 8/2008 | Okanobu | H03F 3/45659 330/285 |
| 2012/0268205 A1 | 10/2012 | Presti | |
| 2014/0354358 A1 | 12/2014 | Kim et al. | |
| 2016/0276982 A1 | 9/2016 | Kang et al. | |
| 2019/0103839 A1* | 4/2019 | Lee | H03F 3/195 |
| 2021/0218376 A1* | 7/2021 | Park | H03F 3/45183 |

OTHER PUBLICATIONS

Chen, T., et al. "Excellent 22FDX Hot-Carrier Reliability for PA Applications," 2019 IEEE Radio Frequency Integrated Circuits Symposium (RFIC), Boston, MA, USA, 2019, pp. 27-30.

Din, I. u., et al. "A 24GHz, 18dBm, Broadband, Three Stacked Power Amplifier in 28nm FDSOI," 2018 IEEE Nordic Circuits and Systems Conference (NORCAS): NORCHIP and International Symposium of System-on-Chip (SoC), Tallinn, Estonia, 2018, pp. 1-4.

Esmael, M. M. R., et al. "A 19-43 GHz Linear Power Amplifier in 28nm Bulk CMOS for 5G Phased Array," 2019 IEEE Topical Conference on RF/Microwave Power Amplifiers for Radio and Wireless Applications (PAWR), Orlando, FL, USA, 2019, pp. 1-3.

International search Report and Written Opinion for International PCT Application No. PCT/US2022/020250 filed on Mar. 14, 2022, on behalf of pSemi Corporation. dated Jun. 27, 2022. 10 Pages.

* cited by examiner

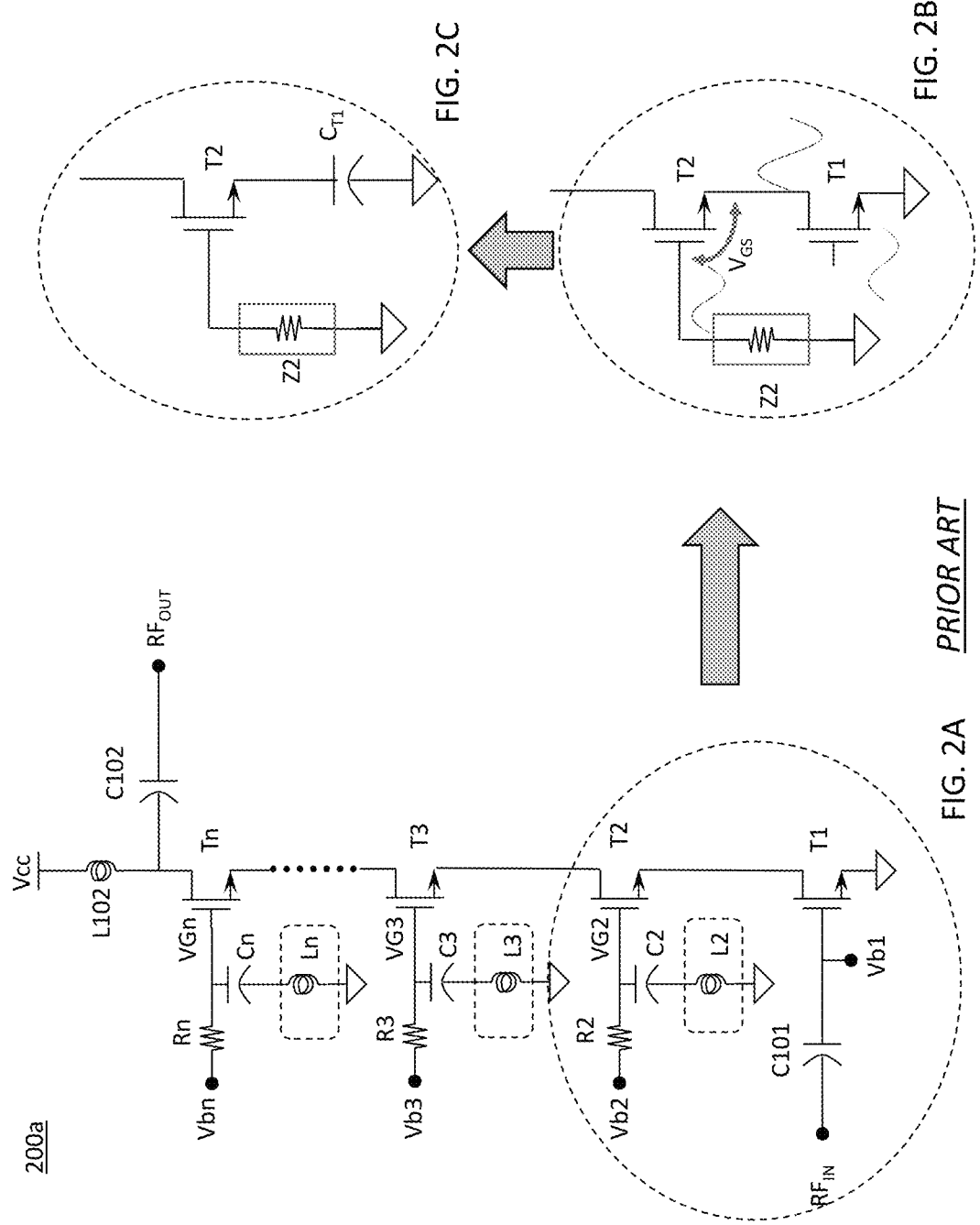
FIG. 2A  *PRIOR ART*

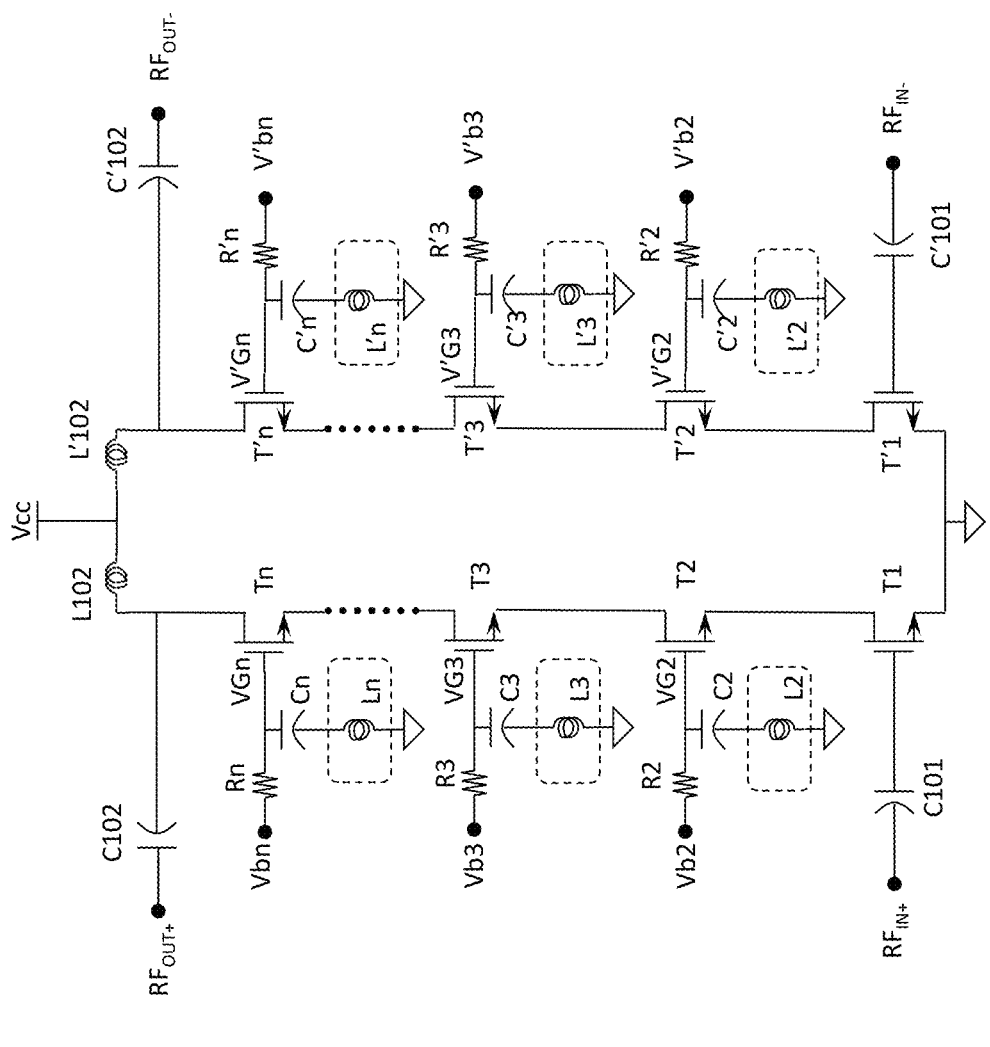
FIG. 3 *PRIOR ART*

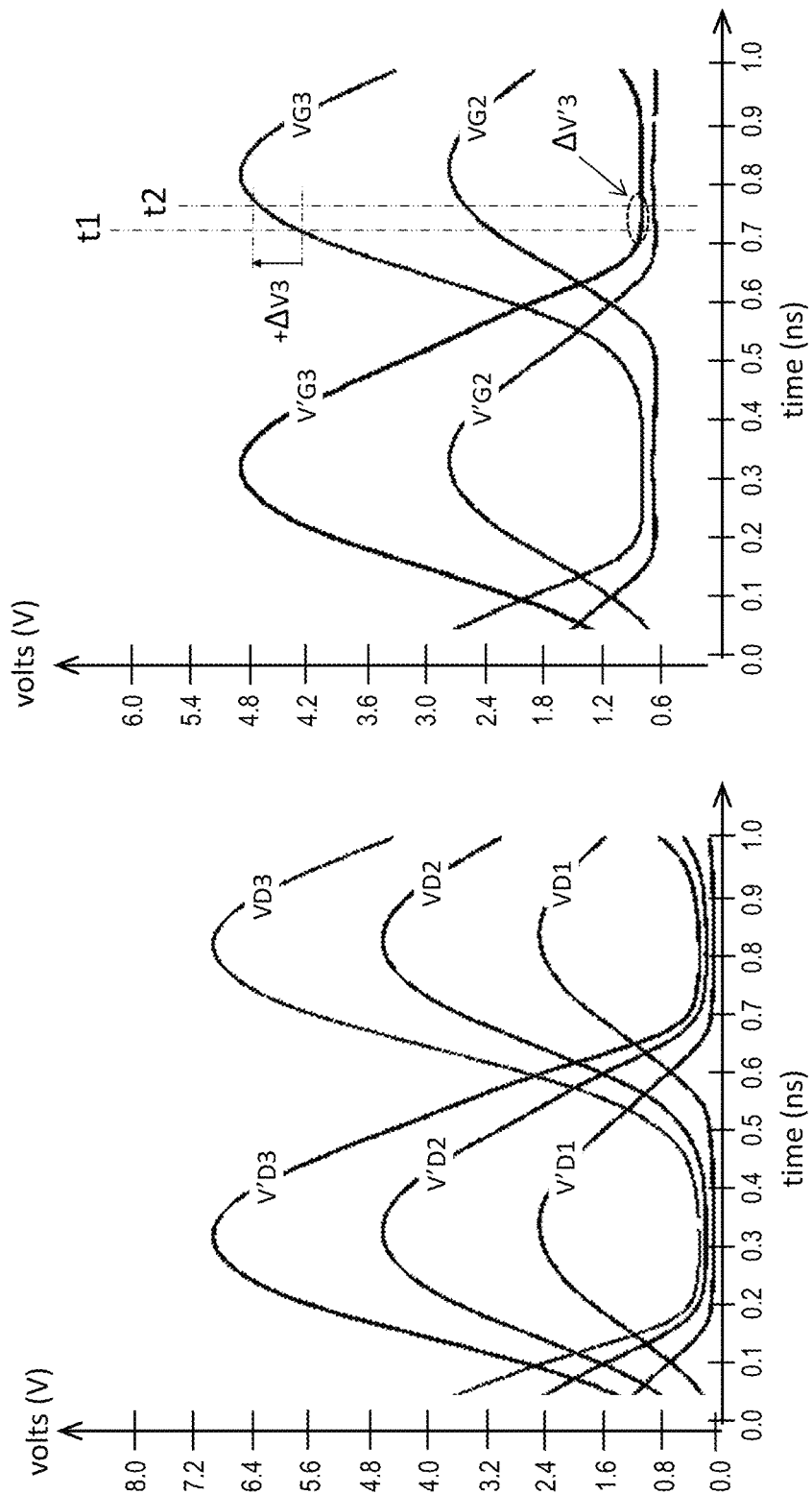

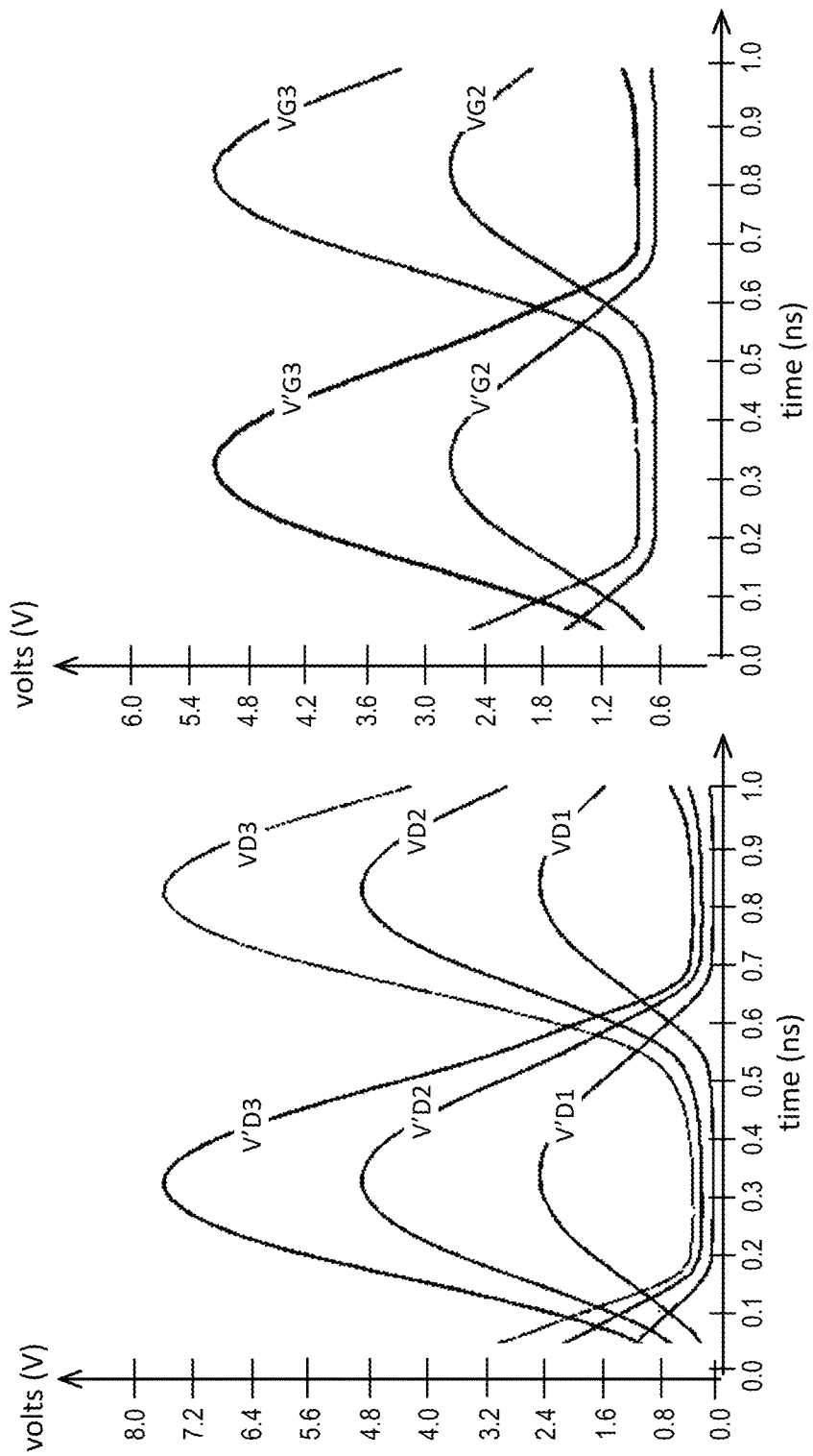

DIFFERENTIAL CASCODE AMPLIFIER ARRANGEMENT WITH REDUCED COMMON MODE GATE RF VOLTAGE

TECHNICAL FIELD

The present application generally relates to electronic circuits, and more specifically to methods and devices for reducing gate node instability in a differential cascode amplifier arrangement.

BACKGROUND

It is well known in the art that when considering interconnecting traces in electronic circuits, including monolithically integrated circuits, such traces can provide undesired parasitic inductance having corresponding impedances that become increasingly significant with higher frequencies of operation of the circuit. Although it may be desired to reduce the parasitic inductance, such reduction is not always possible and therefore, as the frequency of operation increases, effects of the parasitic inductance needs to be accounted for, and when possible, compensated for. For example, let's consider the prior art stacked cascode amplifier (100a) of FIG. 1A, where gate capacitors (C2, . . . , Cn) are coupled between respective gate nodes (VG2, . . . , VGn) of the cascode transistors (T2, . . . , Tn) and a reference ground (e.g., AC ground, substantially constant DC voltage). In some implementations, the gate capacitors (C2, . . . , Cn) may be selected to have impedance values (e.g., $Z_{C2}$ of FIG. 1B) of about zero ohms at the frequency of operation of the amplifier (100a), and therefore couple at the frequency of operation of the amplifier, the reference AC ground to the respective gate nodes (VG2, . . . , VGn). In other implementations, gate capacitors (C2, . . . , Cn) may be selected to have a non-zero impedance values (e.g., Zc2 of FIG. 1B) at the frequency of operation of the amplifier (100a) such as to allow coupling of RF voltages at the respective gate nodes (VG2, . . . , VGn) thereby providing a desired division/distribution of an RF voltage output by the amplifier (100a) across the transistors (T1, T2, . . . , Tn). Responsive to an input RF signal, RFin, provided to the input transistor T1 of the amplifier (100a), an amplified RF signal is obtained at the drain of the input transistor T1, and therefore a corresponding current passes through the cascode transistor T2, and is passed on to subsequent cascode transistors (T3, . . . , Tn).

With continued reference to FIG. 1A, a person skilled in the art would realize that a connection between the gate capacitors (C2, . . . , Cn) and the reference ground may include a finite non-zero parasitic inductance due, for example, to a finite physical length of a trace between each gate capacitor (C2, . . . , Cn) and the reference ground. Therefore, a more accurate representation of the stacked cascode amplifier (100a) of FIG. 1A may be provided by the configuration depicted in FIG. 2A, where such parasitic inductance (L2, . . . , Ln) between the gate capacitors (C2, . . . , Cn) and the reference ground is accounted for. For example, as shown in FIG. 2B, at the frequency of operation of the amplifier (200a) and irrespective of the impedance value of a gate capacitance C2, the combination of the gate capacitance C2 and a respective parasitic inductance L2 always provides a non-zero impedance, Z2, coupled to the gate of the first cascode transistor T2. Such non-zero impedance Z2 providing a voltage division of the amplified RF signal by the input transistor T1 not envisioned in the design of the amplifier. In other words, the gate-to-source (RF) voltage VGS of the first cascode transistor T2 no longer represents a value targeted by the design of the amplifier. Furthermore, as shown in FIG. 2C, the first cascode transistor T2 sees the drain of the input transistor T1 as equivalent resistive and capacitive (e.g., $C_{T1}$) elements, and therefore, a person skilled in the art would realize that an impedance at the gate of the first cascode transistor T2 may be degenerated by, for example, the coupled capacitance $C_{T1}$, which can therefore result in a negative impedance at the gate of T2. In turn, such negative impedance can rise to instabilities at the gate of T2 at certain frequencies of operation and therefore result in possible oscillation of the amplifier circuit shown in FIG. 2A. Behavior described above with reference to the first cascode transistor T2 may apply to any of the cascode transistors of the amplifier (200a) shown in FIG. 2A.

Teachings according to the present disclosure are aimed to reduce the gate nodes instability described above with reference to the prior art cascode amplifiers by substantially eliminating parasitic inductance coupled to the gate capacitors.

SUMMARY

According to a first aspect of the present disclosure, a differential radio frequency (RF) cascode amplification circuit is presented, the differential RF amplification circuit comprising: a first cascode amplification leg comprising a first input transistor and a first group of cascode transistors including a first output transistor, wherein the first cascode amplification leg is configured to amplify a first input RF signal of a differential RF input signal; a second cascode amplification leg comprising a second input transistor and a second group of cascode transistors including a second output transistor, wherein the second cascode amplification leg is configured to amplify a second input RF signal of the differential RF input signal; and at least one capacitive coupling arrangement coupled between a first gate node of a first cascode transistor of the first group of cascode transistors and a second gate node of a second cascode transistor of the second group of cascode transistors, wherein the at least one capacitive coupling arrangement comprises a shunting capacitor.

According to a second aspect of the present disclosure, a method for reducing gate node parasitic inductance in a differential radio frequency (RF) cascode amplification circuit is presented, the method comprising: providing a differential RF cascode amplification circuit comprising symmetrical node pairs of first and second cascode amplification legs; coupling a capacitive coupling arrangement between a first gate node of a cascode transistor of the first cascode amplification leg and a second gate node of a cascode transistor of the second cascode amplification leg, the capacitive coupling comprising a shunting capacitor; based on the coupling, creating an AC reference voltage at an intermediate gate node provided by the shunting capacitor; based on the coupling and the creating, capacitively coupling via respective first and second capacitors the first and second gate nodes to the intermediate gate node, thereby eliminating a physical ground connection to the first and second capacitors; and based on the eliminating, reducing parasitic inductance at the first and second gate nodes.

DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 2A shows a schematic diagram of the prior art single ended RF cascode amplifier of FIG. 1A inclusive of parasitic inductance at gates of cascode transistors of the amplifier.

FIG. 2B shows an equivalent impedance at a gate of a cascode transistor of the RF cascode amplifier of FIG. 2A at a frequency of operation of the amplifier.

FIG. 2C shows an equivalent capacitance representative of an input transistor coupled to a source of the cascode transistor of FIG. 2B.

FIG. 3 shows a schematic of a prior art differential RF cascode amplifier, inclusive of parasitic inductance at gates of cascode transistors of the amplifier.

FIGS. 7A and 7B show graphs representative of drain and gate RF voltages of transistors of the differential RF cascode amplifier of FIG. 5B operating under large signal conditions.

FIGS. 9A and 9B show graphs representative of drain and gate RF voltages of transistors of the differential RF cascode amplifier of FIG. 8B operating under large signal conditions.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits in electronic devices (e.g., cell phones, radios) having a plurality of devices, such as for example, transistors (e.g., MOSFETs). Persons skilled in the art will appreciate that such electrical circuits comprising transistors can be arranged as amplifiers. As used herein, the expressions "operating frequency" and "frequency of operation" are synonymous and can refer to a frequency of a signal being input to a device (such as an amplifier).

Figures 1A, 1B:
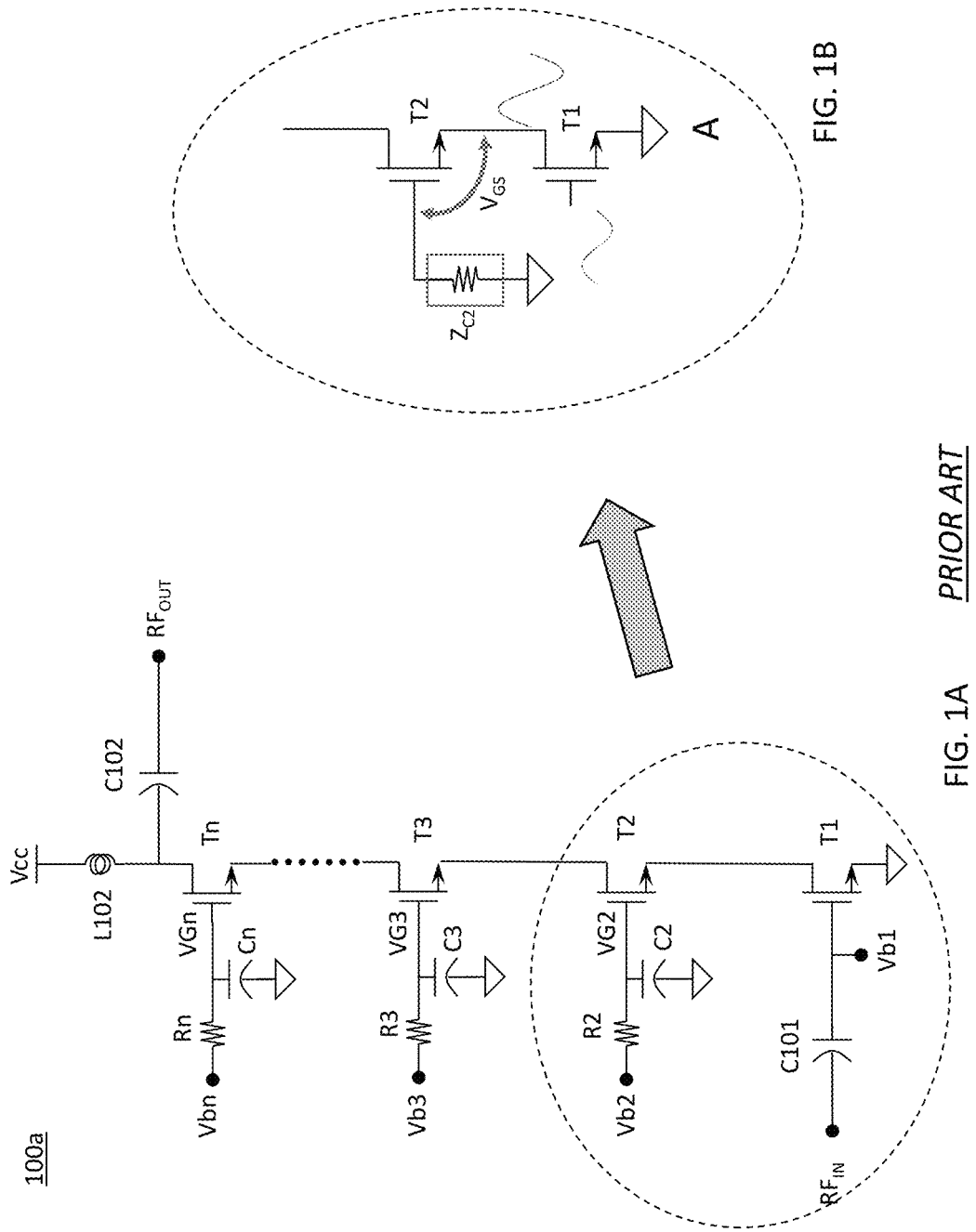
FIG. 1A shows a schematic diagram of a prior art single-ended radio frequency (RF) cascode amplifier.
FIG. 1B shows an equivalent impedance at a gate of a cascode transistor of the RF cascode amplifier of FIG. 1A at a frequency of operation of the amplifier.

The embodiments as described herein are exemplified by N-type MOSFET devices, as shown in the various figures of the present disclosure, used as main conduction elements of an RF amplifier. Such devices can be part of a stack where a plurality of such devices are connected in series so as to operate as a cascode, as shown in FIG. 1A. A person of ordinary skill in the art will readily apply the inventive concepts, as disclosed herein to other types of semiconductor devices, such as P-type MOSFET devices and bipolar junction transistor devices. The embodiments, according to the present invention, can also be applied to extended drain devices, such as laterally diffused metal oxide semiconductor (LDMOS) devices, and other gated transistors or devices as described in the latter part of the present disclosure.

FIG. 1A shows a schematic diagram of a prior art single-ended cascode RF amplifier (100a) that comprises a stack of transistors (T1, T2, . . . , Tn), including an input transistor T1, an output transistor Tn, and cascode transistors T2, . . . , Tn). By way of example and not of limitation, the stacked cascode amplifier (100a) can comprise a stack of 2, 3, 4, . . . , 8 and beyond transistors, where a number n of transistors may be based on a withstand voltage capability of each of the transistors (T1, . . . , Tn) and a desired peak value of an RF voltage (or an RF power) at the drain of the output transistor Tn. In other words, a higher voltage handling performance of the amplifier (100a) may be provided by a higher number of stacked transistors. An input RF signal, RFin, provided at a gate terminal of the input transistor T1 of the amplifier (100a) is amplified by the amplifier (100a). A corresponding amplified output RF signal, RFout, is provided at a drain of the output transistor, Tn, and routed to an output terminal of the amplifier through a bypass capacitor C102. Decoupling capacitors C101 and C102 can be used to decouple low frequency (e.g., DC) biasing voltages provided to the stack of transistors (transistor stack) from the RFin and RFout signals. A supply voltage, Vcc, may be provided to the drain of the output transistor, Tn, through an inductor, L102, and a reference voltage (e.g., GND) is connected to a source of the input transistor T1. Biasing voltages at nodes (VG2, VG3, . . . , VGn) may be provided to respective gates of the cascode transistors (T2, T3, Tn) via series resistors (R2, R3, . . . , Rn) coupled to nodes (Vb2, Vb3, . . . , Vbn) of a biasing circuit. Biasing voltage to the input transistor, T1, can be provided at the node Vb1.

It should be noted that although the amplifier (100a) of FIG. 1A is shown to be powered by a fixed supply voltage Vcc, other configurations of the amplifier (100a) where the supply voltage is variable can also be envisioned. In some exemplary configurations, the supply voltage can be a voltage regulator, or a DC-DC converter. In further exemplary configurations, the supply voltage can vary under control of an external control signal. In some configurations, the control signal can be a function of an envelope signal of the input RF signal, RFin, or the output RF signal, RFout. A person skilled in the art would also know of configurations where the supply to the amplifier is in the form of a current source instead of the exemplary voltage source (e.g., Vcc) discussed in the present disclosure. The teachings according to the present disclosure equally apply to such diverse supply configurations. The exemplary case of a fixed supply discussed in the present disclosure should not be considered as limiting what the applicant considers to be the invention.

The RF amplifier (100a) of FIG. 1A may be used within mobile handsets for current communication systems (e.g. WCMDA, LTE, LTE-CA, WiFi, etc.) wherein amplification of signals with frequency content of above 100 MHz and at power levels of above 50 mW is required. Such amplifiers may also be used to transmit power at frequencies of 20 GHz and beyond, and to loads as dictated by downstream splitters, cables, or feed network(s) used in delivering cable television service to a consumer, a next amplifier in an RF chain at a cellular base station; or a beam forming network in a phased array radar system, and other. The skilled person may find other suitable implementations for the present disclosure, targeted at lower (e.g. audio) frequency systems as well, such as audio drivers, high bandwidth laser drivers and similar. As such, it is envisioned that the teachings of the present disclosure will extend to amplification of signals with frequency content of below 100 MHz as well.

With further reference to the amplifier (100a) depicted in FIG. 1A, the biasing voltages at node (VG2, VG3, . . . , VGn) are such that each transistor (T2, T3, . . . , Tn) of the stack is biased according to a voltage compliance of the transistor. In other words, a voltage across any two terminals (e.g., gate, source, and drain) of each transistor (T1, . . . , Tn) is within a safe operating range of the transistor. As failure of transistor can be a statistical function of applied voltages across the transistors, even when such voltages are within the safe operating range, in some embodiments it may be desirable to subject the transistors of the stack to same voltage ranges so as to provide an equal life expectancy (e.g., mean time before failure) for each transistor of the stack. According to an exemplary embodiment, the gate biasing voltages at nodes (VG2, VG3, . . . , VGn) can be configured to evenly distribute the voltage across the transistor stack, Vcc, amongst the stacked transistors (T1, T2, . . . , Tn). In other words, a drain to source voltage, VDS, of each transistor (T1, T2, . . . , Tn) of the stack is made to be substantially equal to a fraction (1/n) of the voltage provided by the supply voltage Vcc. This can be done, for example in a case where n≥2. According to other exemplary embodiments, the gate biasing voltages can be configured to provide unequal distribution of the voltage Vcc amongst the stacked transistors while operating each of the transistors of the stack within its safe operating range.

As shown in FIG. 1B, the gate capacitors (C2, . . . , Cn) may be selected, for example, to have an impedance value of about zero ohms at the frequency of operation of the amplifier (100b), and therefore provide at the frequency of operation of the amplifier (100b), a reference AC ground (e.g., substantially constant DC voltage) at the respective gate nodes (VG2, . . . , VGn). As shown in FIG. 1B, responsive to an input RF signal, RFin, provided to the input transistor T1 of the amplifier (100a), an amplified RF signal is obtained at the drain of the input transistor T1. Since the gate of the first cascode transistor T2 is held at the AC ground level, then a gate-to-source (RF) voltage VGs of the transistor T2 has an amplitude that is equal to the amplitude of the amplified RF signal by the input transistor T1, and therefore, a corresponding current passes through the cascode transistor T2 which in turn is passed on to subsequent cascode transistors (T3, . . . , Tn). However, as discussed above and depicted in FIG. 2A, a parasitic inductance (L2, . . . , Ln), coupled to the gate capacitors (C2, . . . , Cn), can affect an impedance seen at the gates (gate nodes) of the cascode transistors (T2, . . . , Tn). Accordingly, such impedance can become non-zero at a frequency of operation of the amplifier (200a of FIG. 2A) and provide a voltage division of the amplified RF signal at the drain of the input transistor T1 as shown in FIG. 2B. Finally, as described above, degeneration of the non-zero impedance at, for example, the gate node of the cascode transistor T2, can in turn result in negative impedance at the gate of T2. Such negative impedance can rise to instabilities at the gate of T2 at certain frequencies of operation and therefore result in possible oscillation of the amplifier circuit.

With reference back to FIG. 1A, a person skilled in the art would understand that during operation of the amplifier (100a), an amplified RF signal at the drain of the output transistor (Tn) can be at a voltage level substantially higher (e.g., up to 2 times higher or more) than the Vcc supply voltage. For example, if the gate voltage of the output transistor Tn, as provided by the node VGn, is maintained at a fixed voltage level, and therefore the source of Tn is maintained at a fixed voltage level, then the drain to source voltage, VDS, of the output transistor Tn can be subjected to higher voltage excursions (including the RF signal) beyond the tolerable voltage range of the transistor Tn. Unequal voltage distribution (e.g., division) of the voltage $V_{CC}$ by way of gate biasing voltages, as discussed above, may help to reduce stress exerted on the output transistor Tn due to unequal RF voltage distribution across the transistors of the stack, but may not be sufficient. Accordingly, some prior art embodiments of the amplifier (100a) of FIG. 1A size (the capacitance of) the gate capacitors (C2, . . . , Cn) to allow the gates of the transistors (T2, T3, . . . , Tn) of the stack to float (e.g., with the RF signal). In other words, values of the gate capacitors (C2, . . . , Cn) may be chosen to allow the gate voltage at a respective cascode transistor (T2, . . . , Tn) to vary along (float) with the RF signal at the drain of the respective cascode transistor, which consequently may allow control of the voltage drop (e.g., VDS) across the transistor, thus controlling the conduction of the transistor in accordance to the voltage at its drain, for a more efficient operation of the transistor. The RF voltage across the transistors (e.g. VDS) can therefore be equalized (e.g., via said voltage distribution/division) by choosing the correct combination of gate capacitor and gate bias voltage for each of the cascode transistors (T2, . . . , Tn).

When the gate capacitors (C2, . . . , Cn) are sized to allow floating of the respective gate nodes along with the RF voltage, the parasitic inductances (L2, . . . , Ln) discussed above may equally combine with the gate capacitors (C2, . . . , Cn), as depicted in FIG. 2A, to also affect a non-zero impedance seen at the gate nodes of the cascode transistors (T2, . . . , Tn) at the operating frequency of the amplifier, per FIG. 2B, so to alter the RF voltage division provided by the floating technique discussed above. Further instabilities, including oscillation, as discussed above with reference to FIG. 2C, remain in the case where the gate capacitors are sized to allow floating of the gate nodes, albeit with degrees of severity that may be different at a given frequency of operation.

FIG. 3 shows a schematic of a prior art differential RF cascode amplifier (300), inclusive of parasitic inductance at gates of cascode transistors of the amplifier. A person skilled in the art readily understands operation and benefits provided by such differential configuration, including common mode rejection and symmetry of signals provided in the two cascode amplification legs of the differential configuration. The differential RF cascode amplifier (300) comprises two cascode amplification legs each similar to the single-ended configuration discussed above in reference to FIGS. 1A and 2A. For proper symmetrical operation, the two cascode amplification legs may be matched in components and biasing so to provide a same response with respect to a given input signal. Differential input (RFin+, RFin−) may be provided to respective input transistors (T1, T'1) of the respective cascode amplification legs. Corresponding amplified differential output signal (RFout+, RFout−) may be provided at respective output transistors (Tn, T'n) of the two cascode amplification legs. A person skilled in the art readily knows that other output configurations beyond the exemplary configuration shown in FIG. 3 may be possible, such as, for example, configurations converting the differential output signal to a single ended difference signal.

Figures 4A, 4B:
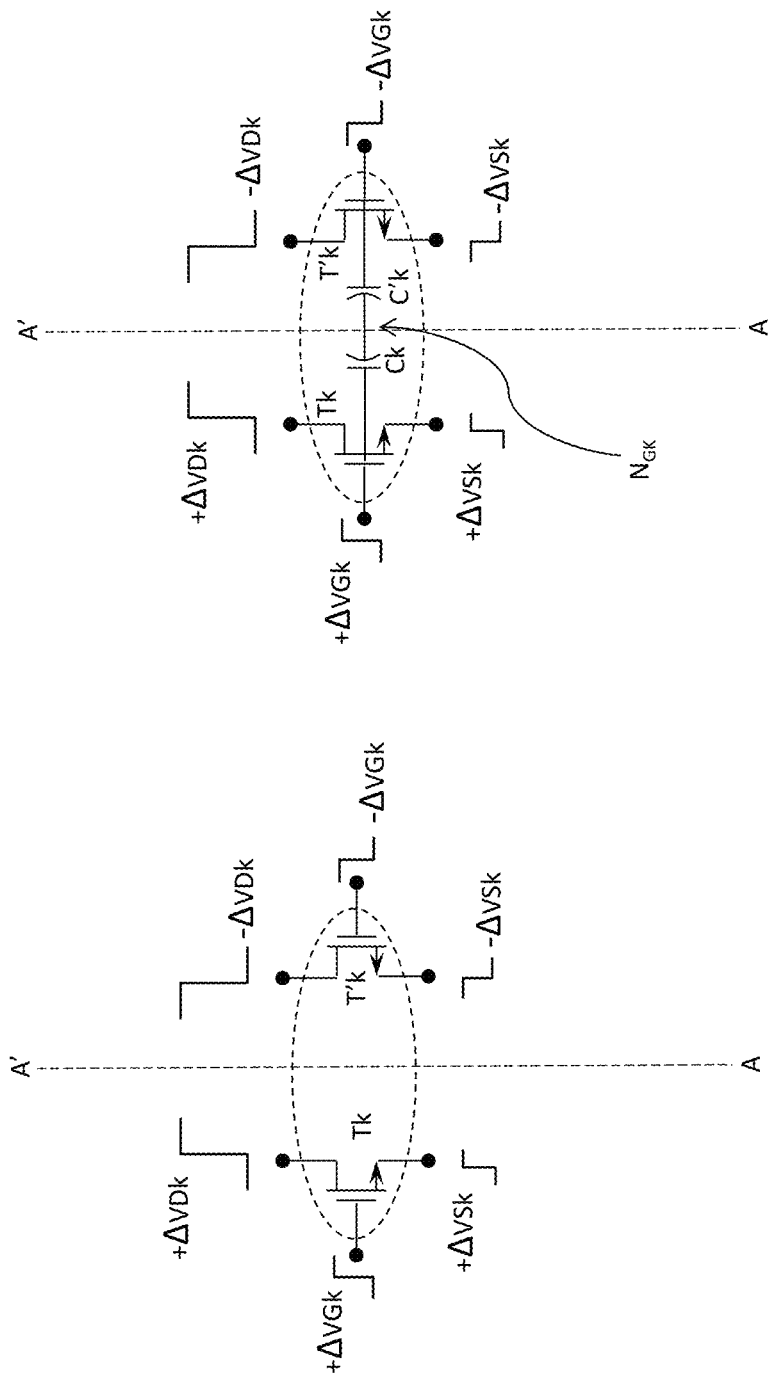
FIG. 4A shows voltage details of a pair of cascode transistors of a differential RF cascode amplifier.
FIG. 4B shows a capacitive coupling arrangement comprising two series connected capacitors coupled between gates of the pair of cascode transistors of FIG. 4A, series connection of the capacitors provided at an intermediate gate node.

FIG. 4A shows voltage details of a pair of cascode transistors (Tk, T'k) of the differential RF cascode amplifier (300) of FIG. 3. As discussed above, symmetry of operation of such configuration dictates existence of node pairs in the respective two amplification legs that are complementary, or in other words, nodes that have (RF) voltages that are complementary, as shown in FIG. 4A. For example, a voltage increase of +ΔVDk/+ΔVGk/+ΔVSk at a drain/gate/source node of the transistor Tk of the first cascode amplification leg is concurrent to a same amplitude voltage decrease of −ΔVDk/−ΔVGk/−ΔVSk at a drain/gate/source node of the transistor T'k of the second cascode amplification leg. Accordingly, a person skilled in the art would realize that by coupling, for example, a pair of gate nodes of the cascode transistors (Tk, T'k) by way of two series connected capacitors (Ck, C'k) having a same capacitance, as shown in FIG. 4B, a common node, $N_{GK}$, where the two capacitors connect, also referred herein as an intermediate gate node, may remain at a substantially steady AC ground level due to symmetry of the design. Such AC ground level may therefore be represented by a virtual ground line AA' shown in FIG. 4B which divides voltages at nodes of the differential RF cascode amplifier (300) of FIG. 3 in complementary RF voltages at respective node pairs on either side of the virtual ground line AA'. It should be noted that the series connected capacitors (Ck, C'k) shown in FIG. 4B, and similar capacitors shown in subsequent figures, are connected to gates of respective transistors (e.g., Tk, T'k), and not to bodies of the transistors.

It should be noted that symmetry of operation of pairs of cascode transistors (e.g., Tk, T'k of FIGS. 4A and 4B) which allows considering the virtual ground line AA' as a virtual equipotential line, may only be possible for a small signal mode of operation of a corresponding differential RF cascode amplifier (e.g., 300 of FIG. 3). For a large signal mode of operation of the amplifier, symmetry of operation of the pairs of cascode transistors (e.g., Tk, T'k of FIGS. 4A and 4B) may no longer exist, and therefore the line AA' shown in FIGS. 4A and 4B may no longer be considered as a virtual equipotential line. As a consequence, and as will be described later in the present disclosure, an AC voltage level at the intermediate gate node (e.g., $N_{GK}$ of FIG. 4B) obtained via the two series connected capacitors (Ck, C'k) shown in FIG. 4B may depend on operation of a corresponding differential RF cascode amplifier (e.g., 500a of FIG. 5A) according to a small signal mode of operation or a large signal mode of operation of a corresponding differential cascode amplifier. As known to a person skilled in the art, low noise amplifiers (LNA's) (always) operate under small signal conditions whereas power amplifiers (PAs) may operate under both small and large signal conditions.

It should be noted that concept of small signal and large signal modes of operation, as well as concept of differential amplifiers, symmetry and even/odd modes of operation, are well known in the art, and therefore a corresponding detailed description may be considered as being outside the scope of the present disclosure. As known to a person skilled in the art, according to a small signal mode of operation, behavior of nonlinear elements, such as transistors, of, for example, an amplifier, may be considered linear, whereas according to a large signal mode of operation, such behavior may be considered as nonlinear. As known to a person skilled in the art, during operation according to a small signal mode of operation, signal levels to transistors of an amplifier are sufficiently low not to affect operating points (e.g., as provided by substantially fixed biasing voltages) to the transistors. On the other hand, during operation according to a large signal mode of operation, signal levels to the transistors of the amplifier are sufficiently high to affect operating points to the transistors, such as, for example, to modify biasing voltages to the transistors. Teachings according to the present disclosure allow to reduce gate node instability for either small signal or large signal modes of operation of a differential RF cascode amplifier.

Figure 5A:
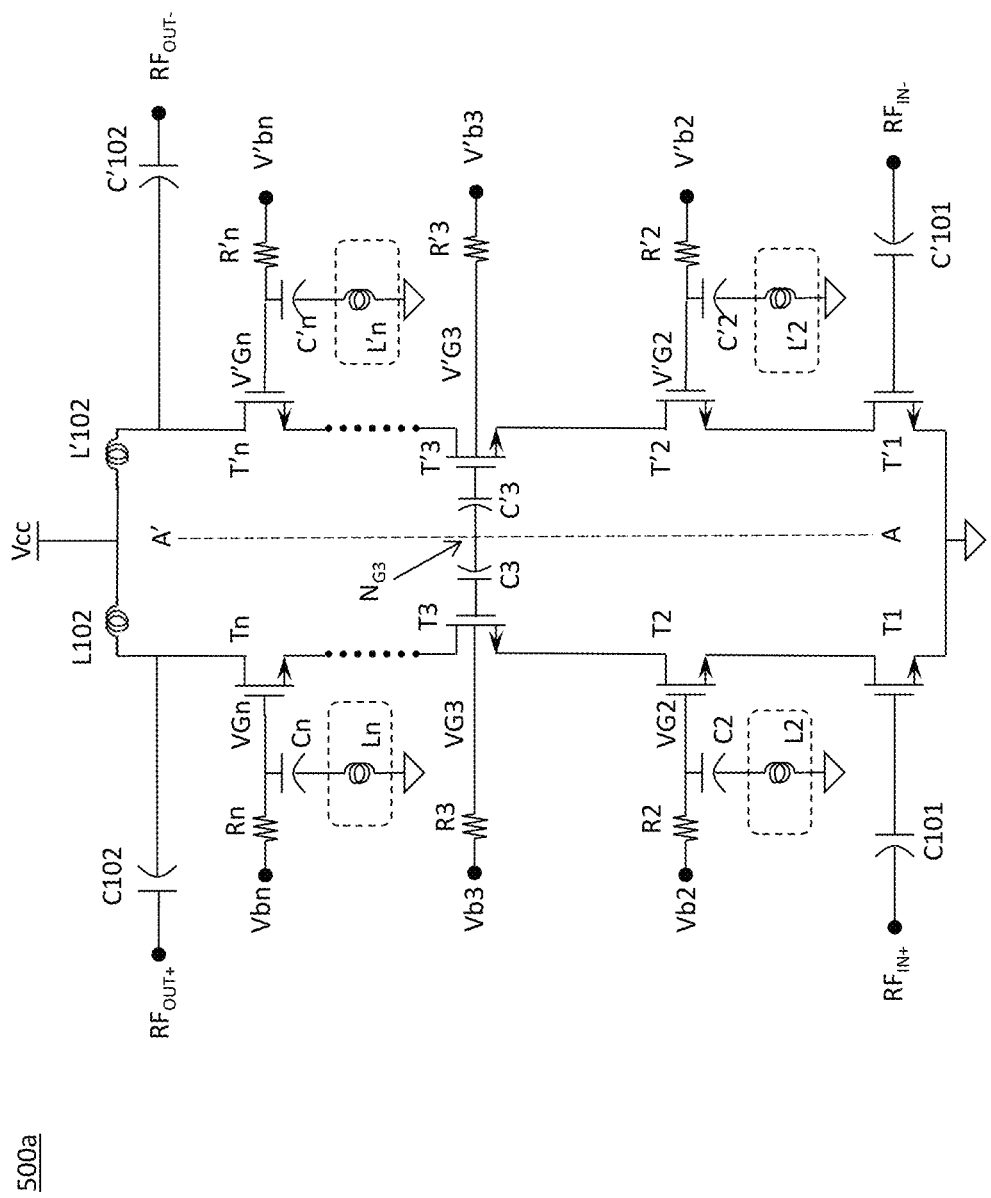
FIG. 5A shows a schematic of a differential RF cascode amplifier comprising the capacitive coupling arrangement according to FIG. 4B.

FIG. 5A shows a schematic of a differential RF cascode amplifier (500a) wherein two series connected capacitors (e.g., C3, C'3) having a same capacitance are coupled between respective gate nodes (e.g. VG3, V'G3) of at least one pair of cascode transistors (e.g., T3, T'3) of the differential amplifier (500a). Because the capacitors (C3, C'3) are coupled to two complementary nodes (VG3, V'G3) of the amplifier (500a), and in view of the discussion above as related to FIGS. 4A and 4B, the intermediate gate node, $N_{G3}$, where the two capacitors (C3, C'3) connect, may be considered at a steady AC ground level, at least during a small signal mode of operation of the amplifier (500a). Accordingly, the configuration shown in FIG. 5A may allow removing a gate return loop provided by a physical trace connecting each of the gate capacitors C3, C'3, to a reference ground. Removal of the gate return loop in turn removes, or substantially reduces, parasitic inductances (e.g., L3, L'3 of FIG. 3) associated with the connecting traces. Therefore, an impedance at a frequency of operation of the amplifier (500a) between each of the gate nodes VG3, V'G3, and AC ground, may solely be a function of a respective gate capacitance C3 and C'3, and without interference from parasitic inductances. Such impedance can be per a specific design and performance goal, whether being a zero impedance at the frequency of operation, or a non-zero impedance to allow the gate floating technique discussed above.

Figure 5B:
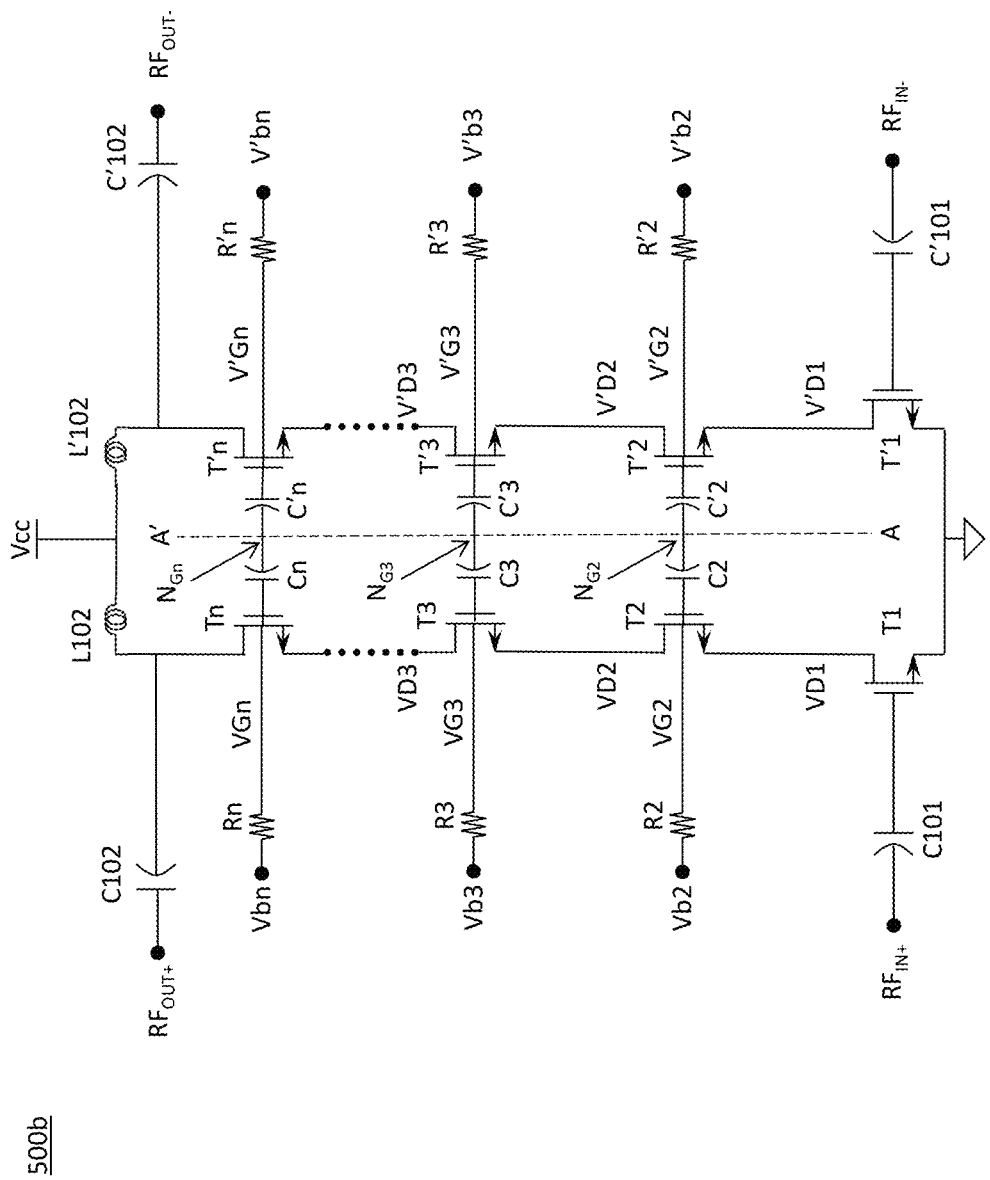
FIG. 5B shows a schematic of a differential RF cascode amplifier comprising a plurality of capacitive coupling arrangements according to FIG. 4B.
Figure 5C:
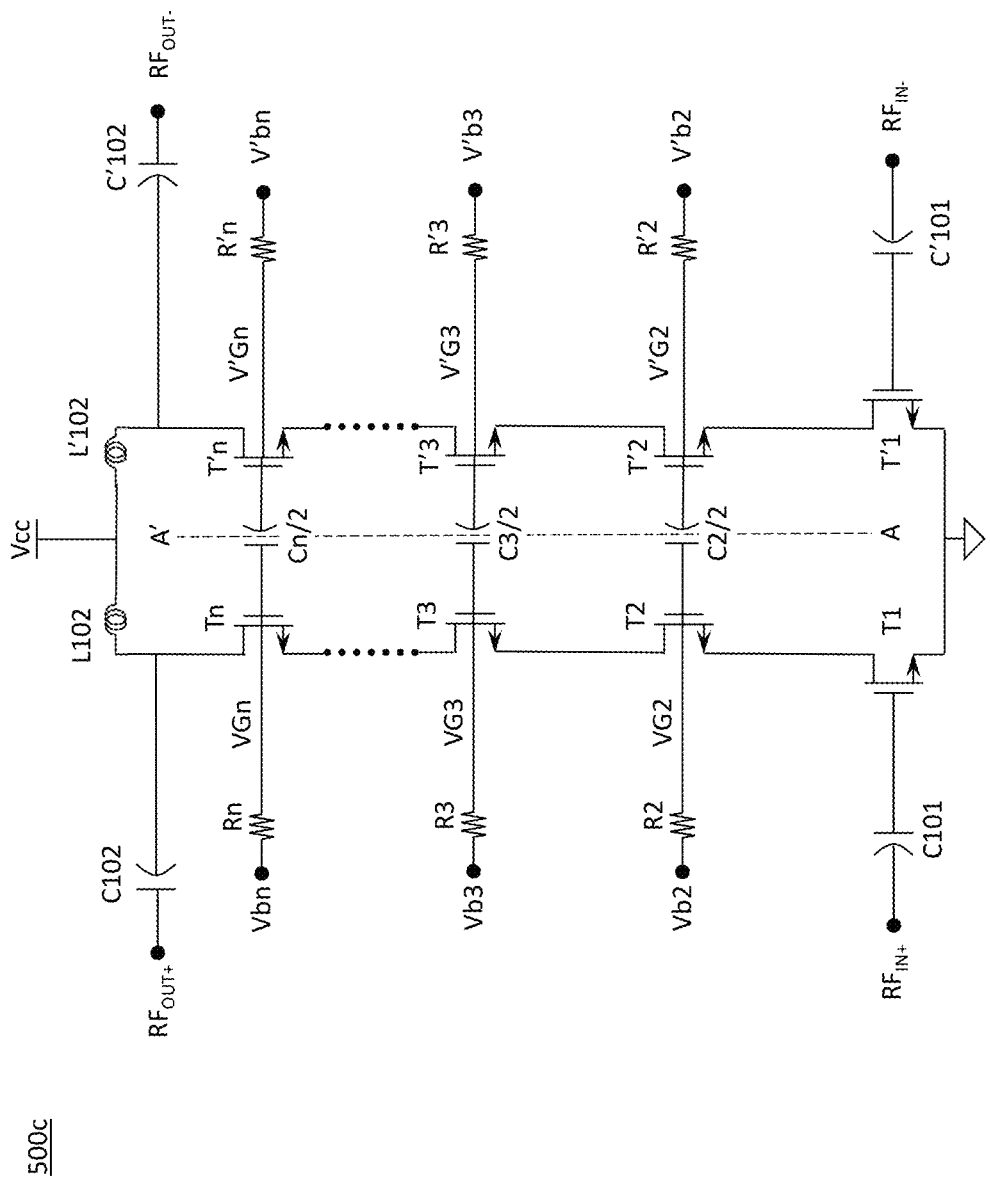
FIG. 5C shows a schematic of a differential RF cascode amplifier comprising one capacitor coupled between respective gates of each pair of cascode transistors of the differential amplifier.

The configuration described above with reference to FIG. 5A can be expanded to any or all of cascode transistor pairs (e.g., (T2, T'2), (T3, T'3), . . . , (Tn, T'n)) of the differential RF cascode amplifier (500a) of FIG. 5A. For example, as shown in the differential RF cascode amplifier (500b) of FIG. 5B, each of the cascode transistors pairs (T2, T'2), (T3, T'3), . . . , (Tn, T'n), can have a capacitive coupling between respective gate nodes (VG2, V' G2), (VG3, V'G3), . . . , (VGn, V'Gn), similar to the capacitive coupling shown in FIG. 5A. It would be understood by a person skilled in the art, that the capacitive coupling can consist of two series connected capacitors having a same capacitance, wherein the (same) capacitance is in view of a desired impedance at a respective gate node at a frequency of operation. In turn, as described above, such desired impedance can be in view of a desired RF voltage distribution of the output RF voltages, $RF_{OUT+}$ and $RF_{OUT-}$, across the transistors of the respective stacks (T1, . . . , Tn) and (T'1, . . . , T'n). As shown in FIG. 5B, capacitors of each pair of series connected capacitors (C2, C'2), . . . , (Cn, C'n) are connected at respective intermediate gate nodes, $N_{G2}$, . . . , $N_{Gn}$, that are shown in FIG. 5B as part of a virtual line AA'. As described above, for a small signal mode of operation of the amplifier (500b) of FIG. 5B, the virtual line AA' may be considered as a virtual AC ground line. Accordingly, for a small signal mode of operation, the intermediate gate nodes, $N_{G2}$, . . . , $N_{Gn}$, may be considered at AC voltage levels that are substantially equal to the reference ground. It should be noted that as shown in FIG. 5C, each of the capacitive couplings (Ck, C'k for k=2, . . . , n) of FIG. 5B can be reduced to a single capacitor of a capacitance equal to Ck*C'k/(Ck+C'k)=Ck/2, and therefore of a smaller physical size for a reduction in corresponding layout area. A person skilled in the art would realize that because of the symmetrical nature of a capacitor structure (e.g., parallel metallic top/bottom plates separated by a dielectric having constant permittivity), a virtual ground line AA' as shown in FIG. 5C may still pass through a middle of the single capacitors coupled between respective gate nodes of the pairs of cascode transistors (T2, T'2), (T3, T'3), . . . , (Tn, T'n), and therefore a capacitance of Ck=C'k may be seen between each of the gate nodes VGk, V'Gk, and the virtual ground line AA'. It should be noted that as described above, the virtual ground line AA' may be considered as such only for a small signal mode of operation of the amplifier (500c) shown in FIG. 5C.

Figure 5D:
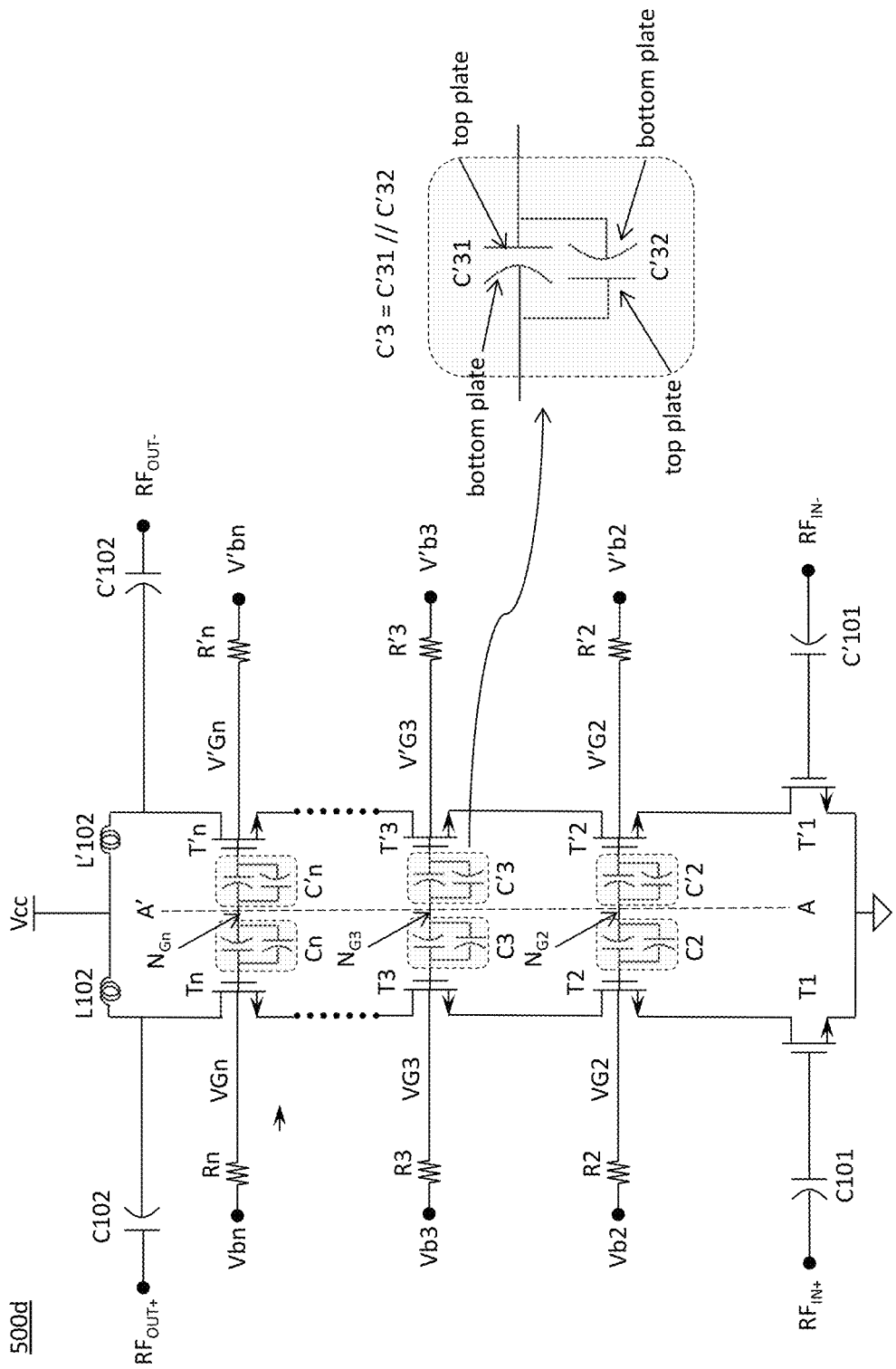
FIG. 5D shows an alternative configuration to the configuration shown in FIG. 5B, wherein one or more of the two series connected capacitors provided by the capacitive coupling arrangement is replaced by a symmetric capacitor comprising two parallel capacitors having the respective top and bottom plates interconnected.

A person skilled in the art would realize that a capacitor may include nonlinearities inherent to a design of the capacitor which may provide a parasitic capacitance that may affect signals through the parasitic capacitance differently in dependence of top and bottom plates of the capacitor. It should be noted that figures of the present disclosure indicate top and bottom plates of capacitors by way of different line shapes (i.e., straight and curved). The parasitic capacitance of the gate capacitors can be equalized (e.g., signal through the capacitor sees substantially same capacitance irrespective of top/bottom plates) by replacing each of the capacitors Ck and C'k of FIG. 5B by two parallel capacitors having their respective top and bottom plates interconnected, as shown in FIG. 5D. In other words, capacitor Ck can be replaced by two capacitors Ck1, Ck2, of a same capacitance Ck/2, where Ck1 and Ck2 are connected in parallel so that the top plate of Ck1 is connected to the bottom plate of Ck2, and the bottom plate of Ck1 is connected to the top plate of Ck2. Such parallel configuration with interconnected top/bottom plates (e.g., also known as anti-parallel configuration) is shown in detail in FIG. 5D for the case of the gate capacitor C'3. It should be noted that any of the gate capacitor connections/couplings shown in FIGS. 5B, 5C, 5D can be used interchangeably within a same differential RF cascode amplifier. In other words, such different gate capacitor connections/couplings can coexist in the same amplifier and be applied to any or all of the pairs of cascode transistors (T2, T'2), (T3, T'3), . . . , and (Tn, T'n).

Figures 6A, 6B:
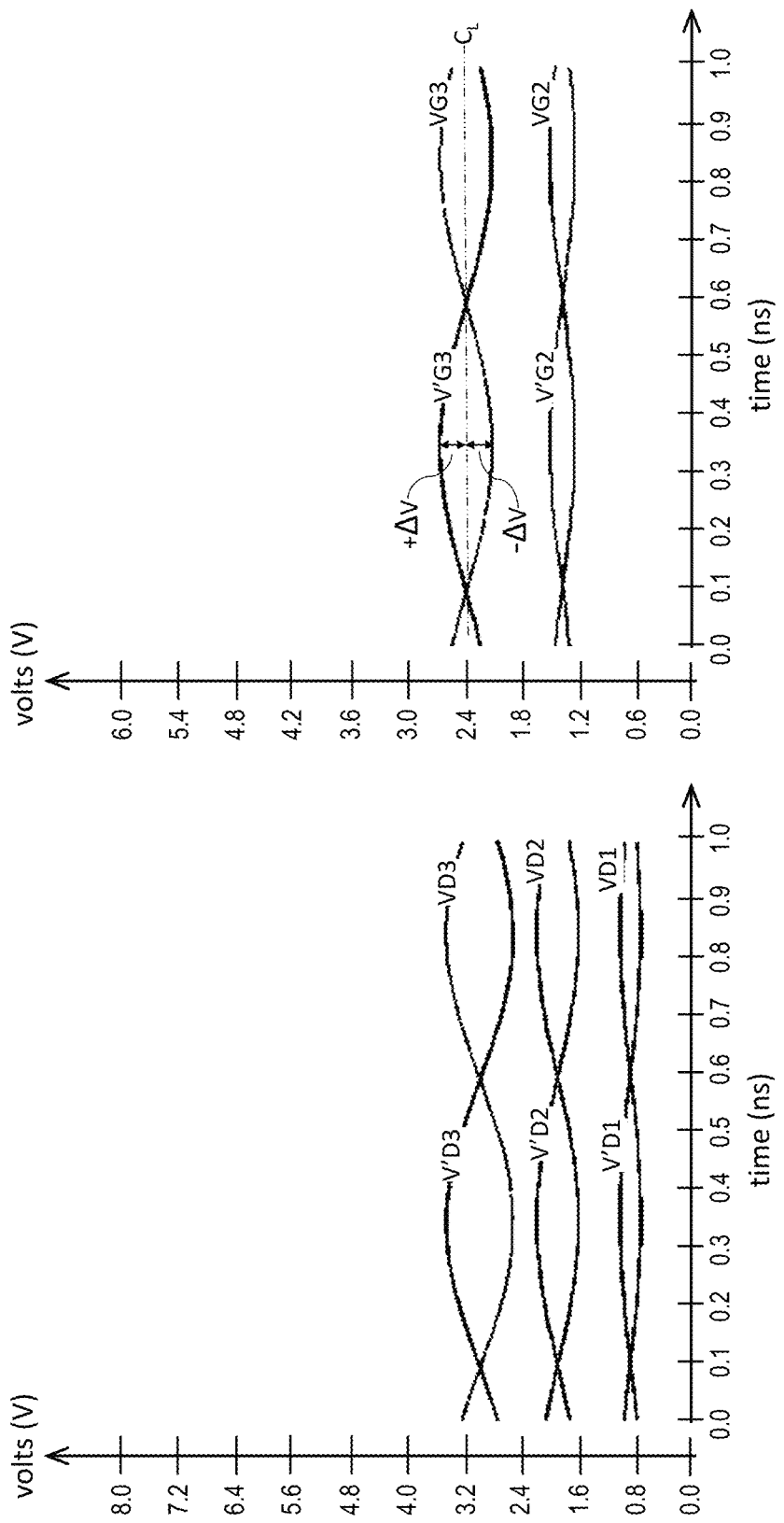
FIGS. 6A and 6B show graphs representative of drain and gate RF voltages of transistors of the differential RF cascode amplifier of FIG. 5B operating under small signal conditions.
Figure 6C:
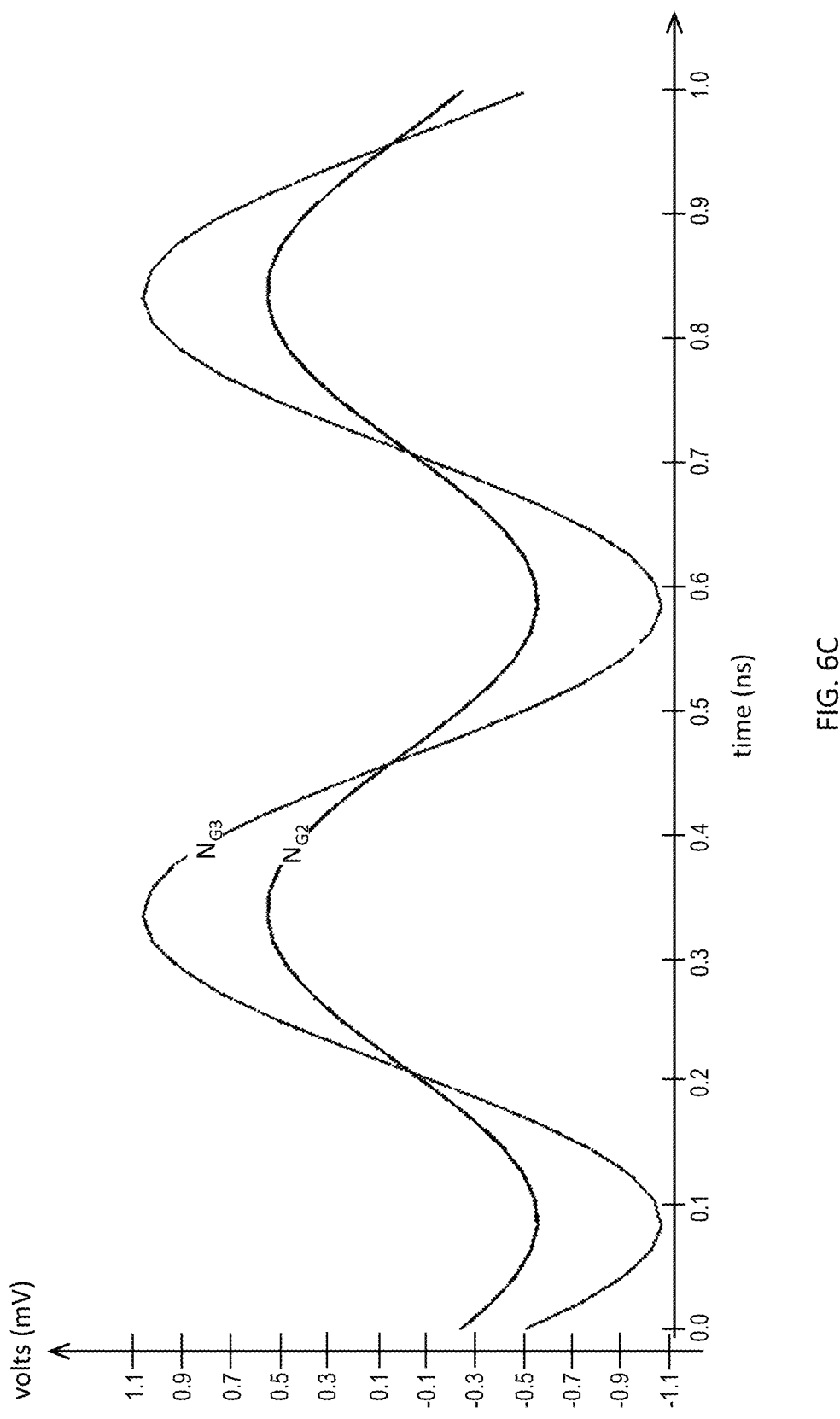
FIG. 6C shows graphs representative of RF voltages at the intermediate gate nodes of the differential RF cascode amplifier of FIG. 5B operating under small signal conditions.

FIGS. 6A and 6B show graphs representative of drain and gate RF voltages of transistors of the differential RF cascode amplifier (500b) of FIG. 5B operating under small signal conditions (e.g., input RF power of about −20 dBm). In particular, drain RF voltages (VD1, VD2, VD3) and gate RF voltages (VG2, VG3) correspond to drain and gate RF voltages of transistors (T1, T2, T3) shown in FIG. 5B, and drain RF voltages (V'D1, V'D2, V'D3) and gate RF voltages (V'G2, V'G3) correspond to drain and gate RF voltages of transistors (T'1, T'2, T'3) shown in FIG. 5B. In other words, each of the voltage pairs (VDk, V'Dk) and (VGk, V'Gk) for k=1, 2, 3 represented in the graphs of FIGS. 6A and 6B can be associated to a respective cascode transistor pair (Tk, T'k) of the amplifier (500b) of FIG. 5B. As can be seen in the graphs shown in FIGS. 6A and 6B, for each of the voltage pairs (VDk, V'Dk) and (VGk, V'Gk) there exists an axis of AC voltage symmetry according to the description above made with reference to FIG. 4B. This is exemplified in the graph of FIG. 6B by a line $C_L$ about which voltages VG3 and V'G3 are (substantially) symmetrical. Moreover, as shown in FIG. 6B, at any given time, an offset about the line $C_L$ of the voltage VG3 is (substantially) complementary to an offset about the line $C_L$ of the voltage V'G3. In other words, the graphs of FIGS. 6A and 6B show that under small signal condition, each pair of cascode transistors (Tk, T'k) operate symmetrically in the sense described above with reference to FIG. 4A. Accordingly, as shown in FIG. 6C, respective intermediate gate nodes, $N_{GK}$, for k=2, 3 of the amplifier (500b) of FIG. 5B are at a substantially steady AC ground level. For example, as shown in FIGS. 6A and 6B, the gate and drain voltages that determine biasing/operation of the cascode transistors of the amplifier (500b) of FIG. 5B are at about 1 volts or larger, and include excursions (AC/RF components) about respective DC voltages (e.g., $C_L$ for VG3 and V' G3) in 100's of millivolts (mV), whereas voltages at the intermediate gate nodes, $N_{GK}$, for k=2, 3 are within 1.1 mV and can therefore be considered at a substantially steady AC ground level.

FIGS. 7A and 7B show graphs representative of drain and gate RF voltages of transistors of the differential RF cascode amplifier (500b) of FIG. 5B operating under large signal conditions (e.g., input RF power of about +2 dBm, or P1dB+6 where P1dB indicates point of 1 dB compression). It should be noted that the drain and gate RF voltages considered in FIGS. 7A and 7B are same as ones considered in FIGS. 6A and 6B described above. Contrary to the graphs shown in FIGS. 6A and 6B, the graphs of FIGS. 7A and 7B do not show an axis of AC voltage symmetry for each of the voltage pairs (VDk, V'Dk) and (VGk, V'Gk). In other words, and as described above, under large signal conditions the axis AA' shown in FIGS. 5A-5D may not be considered a virtual ground line. As can be seen in FIG. 7B for a small change +ΔV3 of the VG3 voltage, the V'G3 voltage does not change by an equivalent amount (e.g., ΔV'3 substantially unchanged), and therefore, symmetrical/complementary operation is no longer the case. Such behavior may be mainly attributed to non-linearities due to operation under large signal conditions.

Figure 7C:
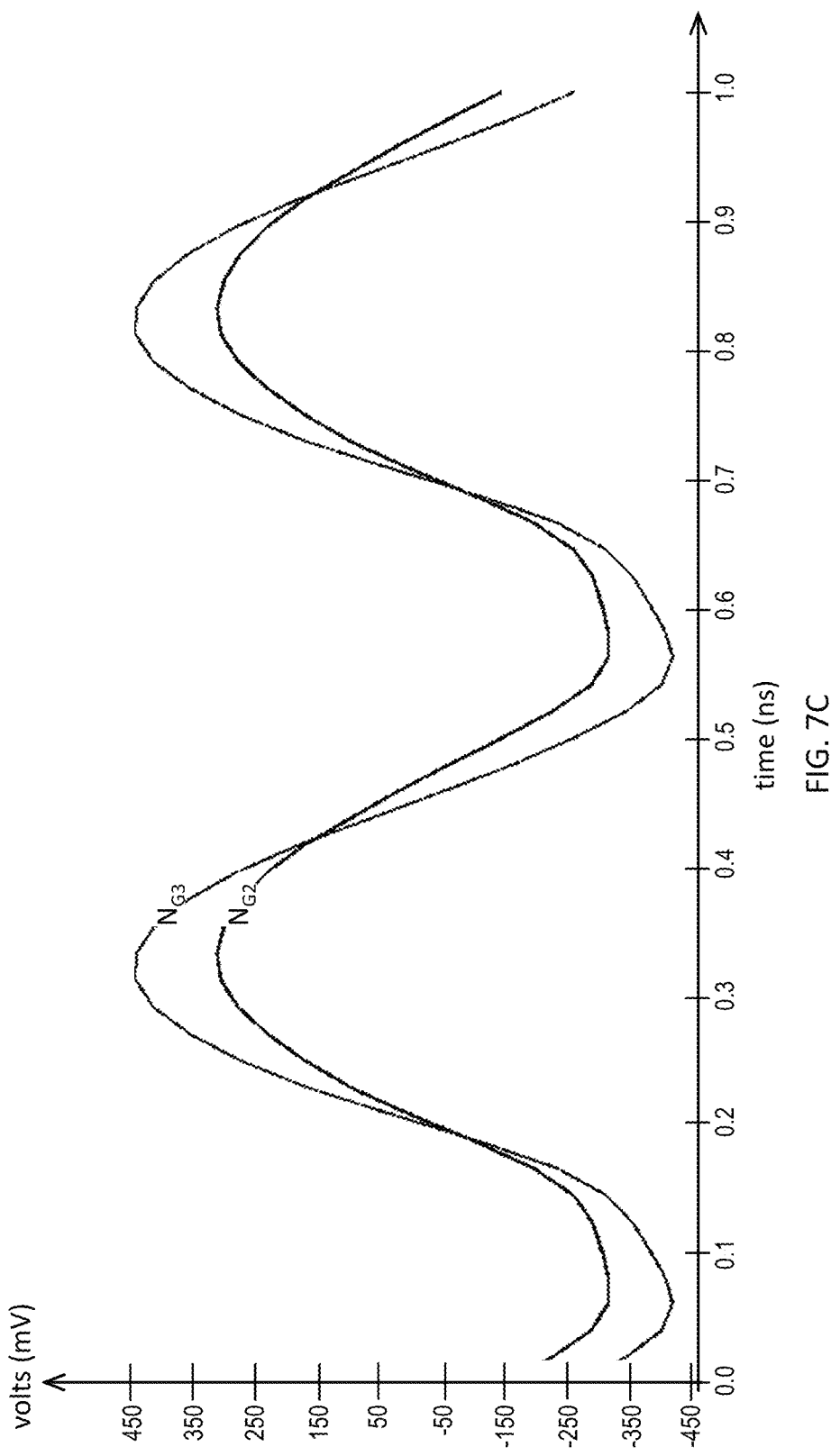
FIG. 7C shows graphs representative of RF voltages at the intermediate gate nodes of the differential RF cascode amplifier of FIG. 5B operating under large signal conditions.

As can be seen in the graphs represented in FIG. 7C, under large signal condition, each of the intermediate gate nodes $N_{GK}$ (e.g., for k=2, 3) can vary substantially when compared to related gate voltage pairs (VG2, V'G2) and (VG3, V'G3) shown in FIGS. 7A and 7B. For example, as can be seen in FIG. 7C, the intermediate gate node $N_{G2}$ can have a peak to peak voltage variation of about 600 mV for a peak to peak voltage variation of about 2 volts for the gate voltage pair (VG2, V'G2 of FIG. 7A), and the intermediate gate node $N_{G3}$ can have a peak to peak voltage variation of about 850 mV for a peak to peak voltage variation of about 3.9 volts for the gate voltage pair (VG3, V'G3 of FIG. 7B). Furthermore, as can be seen in FIG. 7C, voltages at the intermediate gate nodes $N_{GK}$ (e.g., for k=2, 3) include a second harmonic component of the RF voltage signal at the drain and gate nodes of the transistors (e.g., based on the operating frequency of an RF signal processed by the amplifier, wherein over a 1 ns timescale shown in the figures, the drain and gate nodes include one period of the operating frequency and the intermediate gate nodes two periods). Furthermore, nonlinearities that can be observed in the shape of the voltages at the intermediate gate nodes $N_{GK}$ (e.g., for k=2, 3) shown in FIG. 7C may indicate presence of higher order harmonics beyond the second harmonic. Such second and higher order harmonics may in turn couple to an output RF signal of the amplifier and accordingly affect amplifier performance metrics such as adjacent channel rejection ratio (ACLR) and linearity. Furthermore, nonlinear effects present in the two legs of the differential RF cascode amplifier (e.g., 500b of FIG. 5B) due to, for example, the large signal mode of operation of the amplifier or the non-zero voltage at the intermediate gate node, may cross couple via the pairs of series connected gate capacitors (Ck, C'k) such as to further affect amplifier output power as well as RF amplitudes at the respective gate and drain nodes of the cascode transistors pairs (Tk, T'k) which in turn may affect respective RF voltage distributions and potentially cause excess stress on the transistors.

Figure 8A:
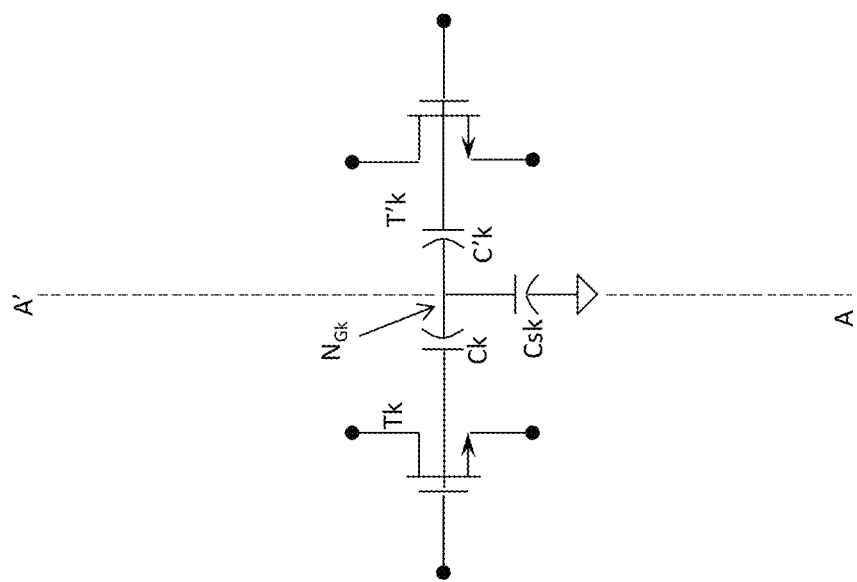
FIG. 8A shows a capacitive coupling arrangement according to an embodiment of the present disclosure, the capacitive coupling arrangement based on the capacitive coupling arrangement of FIG. 4B and further comprising a shunting capacitor coupled to the intermediate gate node.

According to one aspect of the present disclosure, ill effects of series connected gate capacitors (Ck, C'k) according to the configurations described above (e.g., FIGS. 5A-5D) when operating under large signal conditions may be reduced, without impacting operation under small signal conditions, by attenuating the peak to peak variation at the respective intermediate gate nodes $N_{GK}$ (e.g., for k=2, 3, . . . , n). As shown in FIG. 8A, such attenuation may be provided by a shunting capacitor, Csk, coupled to a respective intermediate gate node $N_{GK}$ (e.g., for k=2, 3, . . . , n). In the configuration shown in FIG. 8A, the gate capacitors (Ck, C'k) may be sized/chosen according to a desired RF voltage distribution of the output RF voltages, and according to operating frequencies, as previously described in the present disclosure. Subsequently, the shunting capacitor, Csk, may be sized in view of a desired AC voltage attenuation at the intermediate gate node $N_{GK}$. It should be noted that the graphs described in the present disclosure are provided by simulation tools and accordingly same simulation tools may be used to size the shunting capacitor, Csk. Sizing of the shunting capacitor, Csk, may be in view of one or more performance metrics of the amplifier. Such sizing may effectively be in view of a compromise on the one or more performance metrics, such as for example, output power, output harmonics, ACLR, linearity, etc., when considering parameters such as modulation schemes, amplifier class of operation and maximum output power.

With continued reference to FIG. 8A, according to an exemplary embodiment of the present disclosure, the shunting capacitor, Csk, may be sized to have a capacitance that is at least about twice the capacitance of the gate capacitors Ck or C'k, and preferably in a range from about five times to about ten times the capacitance of the gate capacitors Ck or C'k. It should be noted that in this context, as well as in the context of the present application, the term "about" may encompass values within +/−10% of a target value. It should be noted that although larger sizes of the shunting capacitor, Csk, such as to provide capacitances larger than about ten times the capacitance of the gate capacitors Ck or C'k, may further attenuate the peak to peak variation at the respective intermediate gate nodes $N_{GK}$ (e.g., for k=2, 3, . . . , n), such larger sizes may not be desirable as they may require a larger on chip physical layout of the shunting capacitor, Csk, and therefore a potential remote placement of said shunting capacitor relative to the gate capacitors and associated transistors. In turn, such remote placement of the larger shunting capacitor, Csk, may introduce undesired parasitic inductance as described above with reference to, for example, FIG. 2A.

Figure 8B:
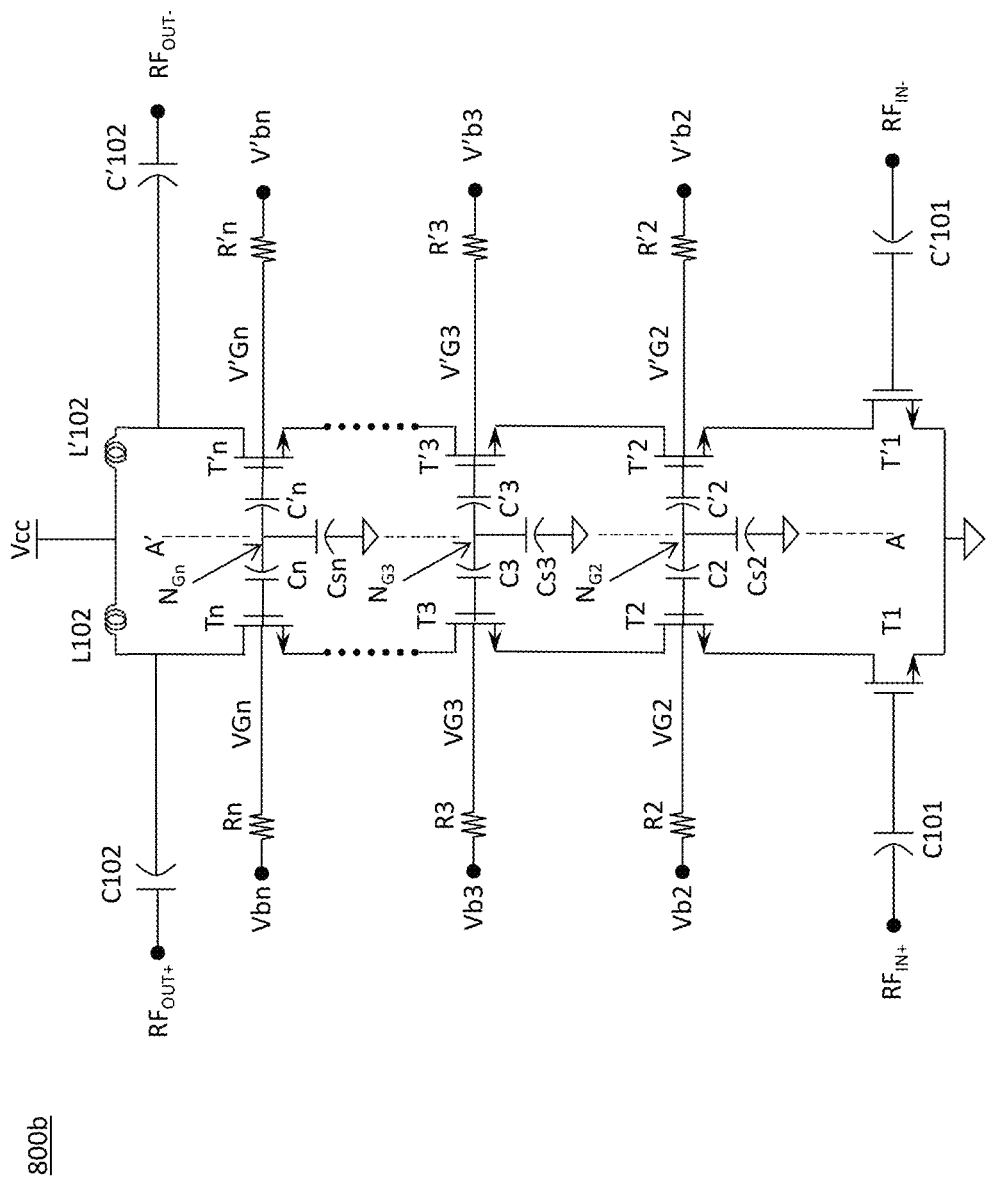
FIG. 8B shows a schematic of a differential RF cascode amplifier according to an embodiment of the present disclosure comprising the capacitive coupling arrangement shown in FIG. 8A.
Figure 8C:
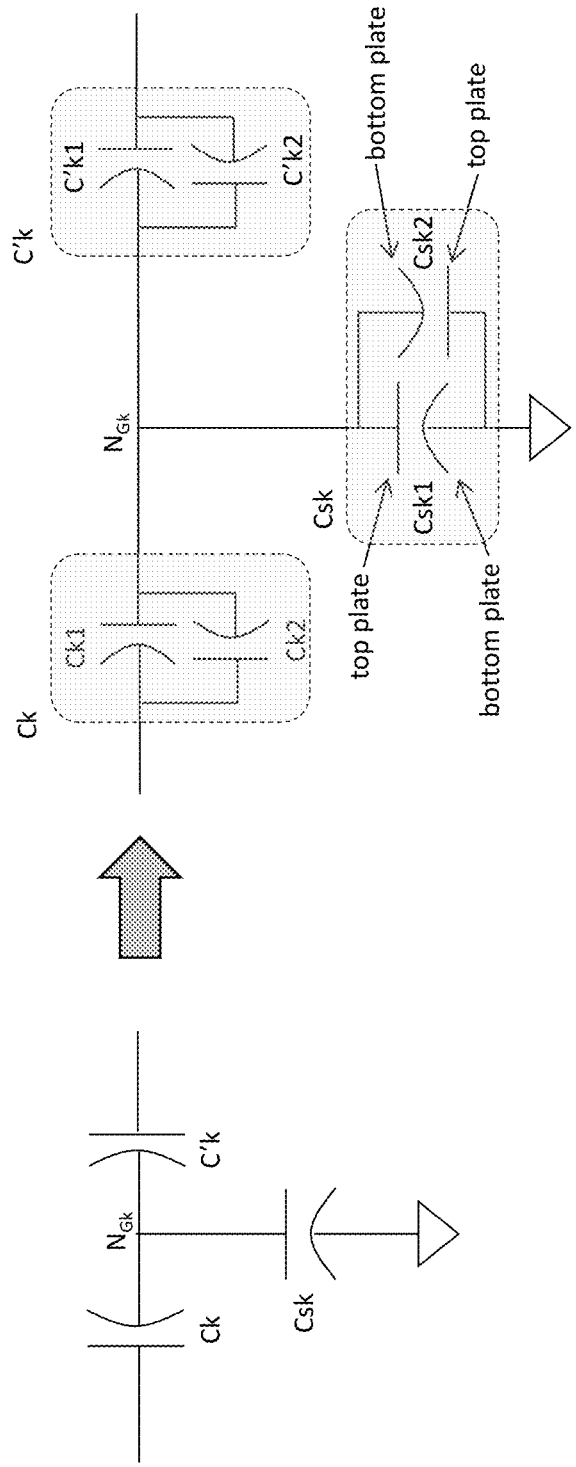
FIG. 8C shows an alternative configuration to the capacitive coupling arrangement shown in FIG. 8A, wherein one or more of the two series connected capacitors provided by the capacitive coupling arrangement is replaced by a symmetric capacitor comprising two parallel capacitors having the respective top and bottom plates interconnected.

The capacitive coupling arrangement (Ck, Csk, C'k) shown in FIG. 8A may be coupled to any or all the pairs of cascode transistors of a differential cascode amplifier. For example, FIG. 8B shows a differential cascode amplifier (800b) wherein each of the pairs of cascode transistors (Tk, T'k), k=2, 3, . . . , n, is coupled to a respective capacitive coupling arrangement (Ck, Csk, C'k). It should be noted that one or more of the capacitors Ck, Csk or C'sk may be configured according to an anti-parallel configuration described above with reference to FIG. 5D. For example, FIG. 8C shows the capacitive coupling arrangement (Ck, Csk, C'k) wherein each of the capacitors Ck, Csk and C'k is configured according to an anti-parallel configuration, such as, Ck=Ck1//Ck2, Csk=Csk1//Csk2, and C'k=C'k1//C'k2. According to an exemplary configuration of the present disclosure, each of the shunting capacitors (Cs2, Cs3, . . . , Csn) of the differential cascode amplifier (800b) shown in FIG. 8B may be according to the anti-parallel configuration C'k=C'k1//C'k2 shown in FIG. 8C. It should be noted that as used herein, the expressions "capacitive coupling", "capacitive coupling circuit" and "capacitive coupling arrangement" are synonymous and refer to a circuit consisting of interconnected capacitors, such as, for example, the circuit (Ck, C'k) of FIG. 5A or the circuit (Ck, Csk, C'k) of FIG. 8A, that is configured to be coupled/connected to nodes of a circuit to be affected (e.g., nodes of cascode transistors). It would be clear to a person skilled in the art, that in a physical circuit implementation, such capacitive coupling may include interconnecting parasitic impedances (e.g., inductance, resistance) which are not designed into the circuit, but rather side effects of the physical circuit implementation. In other words, no inductors and/or resistors are designed into the capacitive coupling.

Figure 9C:
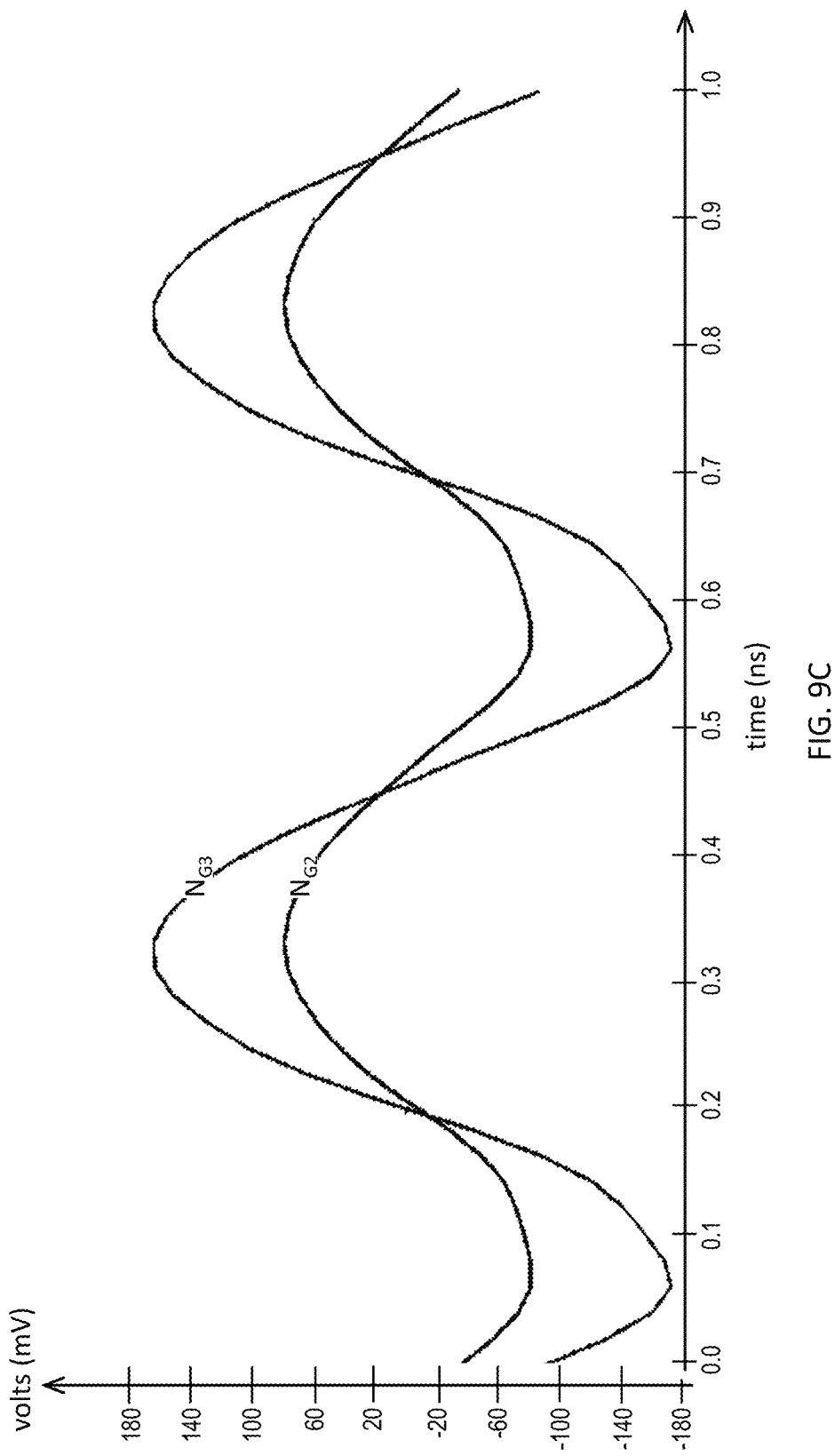
FIG. 9C shows graphs representative of RF voltages at the intermediate gate nodes of the differential RF cascode amplifier of FIG. 8B operating under large signal conditions.

FIGS. 9A and 9B show graphs representative of drain and gate RF voltages of transistors of the differential RF cascode amplifier (800b) of FIG. 8B operating under large signal conditions, wherein the capacitance of the shunting capacitor Csk, for k=2, 3 is equal to five times the capacitance of corresponding capacitor Ck or C'k. Furthermore, FIG. 9C shows graphs representative of RF voltages at the intermediate gate nodes (e.g., $N_{G2}$, $N_{G3}$) of the differential RF cascode amplifier (800b) of FIG. 8B operating under large signal conditions. The graphs shown in FIGS. 9A, 9B and 9C may be contrasted to respective graphs shown in FIGS. 7A, 7B and 7C described above, as such graphs represent voltages at respective nodes of the amplifiers (800b) and (500b) under same large signal conditions (e.g., input RF power of about +2 dBm, or P1dB+6). For example, contrasting the drain voltages (VD3, V'D3) of FIG. 9A to those of FIG. 7A, one can observe higher peak values for the drain voltages shown in FIG. 9A. In general, one can observe higher peak values for any of the drain or gate voltages shown in FIGS. 9A and 9B when compared to those of FIGS. 7A and 7B. Such higher voltages, in particular the drain voltages (VD3, V'D3) for a case where a height of each of the two legs of the differential cascode amplifier (800b) is three (i.e., T3 and T'3 are the output cascode transistors), may be indicative of a higher output power of the amplifier (800b) when compared to the amplifier (500b). In particular, applicant of the present disclosure has observed an increase in output power of the amplifier (800b) of 0.1 dB and 0.5 dB for a respective input power of −4 dBm and +2 dBm when comparing to the amplifier (500b).

Furthermore, contrasting the peak to peak voltage variation of the intermediate gate nodes shown in FIG. 9C to the peak to peak voltage variation of the intermediate gate nodes shown in FIG. 7C, one can observe a substantially higher (e.g., about three times higher) peak to peak voltage value in FIG. 7C. In other words, the capacitive coupling (Ck, Csk, C'k) used in the differential RF cascode amplifier (800b) may provide an attenuation of the voltage at the intermediate gate nodes, $N_{GK}$, which in turn may allow for a lower level of signal distortion (e.g., as provided by higher order harmonics) at the output of the amplifier (800b). As described above and according to various embodiments of the present disclosure, such attenuation of the voltage at the intermediate gate nodes, $N_{GK}$, may be controlled via selection of a size (capacitance) of the capacitor Csk.

Figure 10:
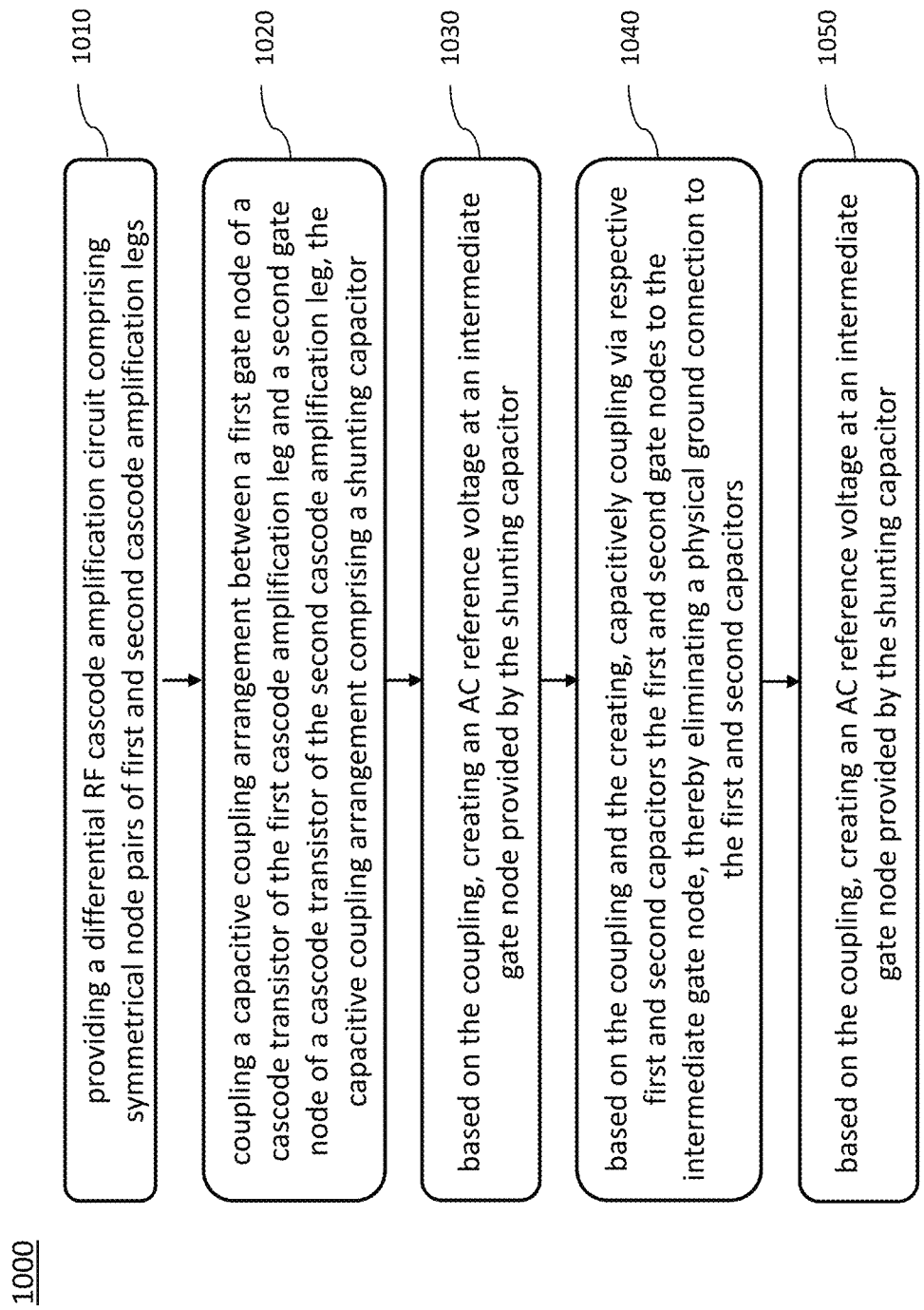
FIG. 10 is a process chart showing various steps of a method for reducing gate node parasitic inductance in a differential radio frequency (RF) cascode amplification circuit according to an embodiment of the present disclosure.

FIG. 10 is a process chart (1000) showing various steps of a method for reducing gate node parasitic inductance in a differential radio frequency (RF) cascode amplification circuit according to an embodiment of the present disclosure. As can be seen in FIG. 10, such steps comprise: providing a differential RF cascode amplification circuit comprising symmetrical node pairs of first and second cascode amplification legs, per step (1010); coupling a capacitive coupling arrangement between a first gate node of a cascode transistor of the first cascode amplification leg and a second gate node of a cascode transistor of the second cascode amplification leg, the capacitive coupling arrangement comprising a shunting capacitor, per step (1020); based on the coupling, creating an AC reference voltage at an intermediate gate node provided by the shunting capacitor, per step (1030); based on the coupling and the creating, capacitively coupling via respective first and second capacitors the first and second gate nodes to the intermediate gate node, thereby eliminating a physical ground connection to the first and second capacitors, per step (1040); and based on the eliminating, reducing parasitic inductance at the first and second gate nodes, per step (1050).

It should be noted that the various embodiments of the protection circuit according to the present disclosure, including a low voltage circuit to be protected, may be implemented as a monolithically integrated circuit (IC) according to any fabrication technology and process known to a person skilled in the art.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies.

However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a sensor, a cellular telephone, laptop or personal computer, an electronic tablet, or a workstation, or to form a higher-level module which may be used in a wide variety of products, such as vehicles, test equipment, medical devices, servers, such as edge servers, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A differential radio frequency (RF) cascode amplification circuit comprising:
   a first cascode amplification leg comprising a first input transistor and a first group of cascode transistors including a first output transistor, wherein the first cascode amplification leg is configured to amplify a first input RF signal of a differential RF input signal;
   a second cascode amplification leg comprising a second input transistor and a second group of cascode transistors including a second output transistor, wherein the second cascode amplification leg is configured to amplify a second input RF signal of the differential RF input signal; and
   at least one capacitive coupling arrangement coupled between a first gate node of a first cascode transistor of the first group of cascode transistors and a second gate node of a second cascode transistor of the second group of cascode transistors,
   wherein:
   the at least one capacitive coupling arrangement comprises a shunting capacitor; the shunting capacitor comprises two parallel capacitors of a same value,
   each of the two parallel capacitors comprises a top conductive plate and a bottom conductive plate,
   the top conductive plate of a first capacitor of the two parallel capacitors is connected to the bottom conductive plate of a second capacitor of the two parallel capacitors, and
   the bottom conductive plate of the first capacitor of the two parallel capacitors is connected to the top conductive plate of the second capacitor of the two parallel capacitors.

2. The differential radio frequency (RF) cascode amplification circuit of claim 1, wherein the first and the second cascode amplification legs are coupled between a fixed supply voltage and a reference ground.

3. The differential radio frequency (RF) cascode amplification circuit of claim 1, wherein the first and the second cascode amplification legs are coupled between a variable supply voltage and a reference ground.

4. The differential radio frequency (RF) cascode amplification circuit of claim 3, wherein the variable supply voltage varies under control of an external control signal.

5. The differential radio frequency (RF) cascode amplification circuit of claim 1, wherein the first and second input transistors and the first and second groups of cascode transistors are metal-oxide-semiconductor (MOS) field effect transistors (FETs), or complementary metal-oxide-semiconductor (CMOS) field effect transistors (FETs).

6. The differential radio frequency (RF) cascode amplification circuit of claim 5, wherein said transistors are fabricated using one of: a) silicon-on-insulator (SOI) technology, and b) silicon-on-sapphire technology (SOS).

7. An electronic module comprising the differential radio frequency (RF) cascode amplification circuit of claim 1.

8. A method, comprising using of the electronic module of claim 7 in one or more electronic systems comprising: a) a sensor, b) a cellular telephone, c) a laptop or personal computer, d) a workstation, e) a test equipment, f) an edge server, g) a vehicle, h) a medical device, or i) other electronic systems.

9. A differential radio frequency (RF) cascode amplification circuit comprising:
   a first cascode amplification leg comprising a first input transistor and a first group of cascode transistors including a first output transistor, wherein the first cascode amplification leg is configured to amplify a first input RF signal of a differential RF input signal;
   a second cascode amplification leg comprising a second input transistor and a second group of cascode transistors including a second output transistor, wherein the second cascode amplification leg is configured to amplify a second input RF signal of the differential RF input signal; and
   at least one capacitive coupling arrangement coupled between a first gate node of a first cascode transistor of the first group of cascode transistors and a second gate node of a second cascode transistor of the second group of cascode transistors,
   wherein the at least one capacitive coupling arrangement comprises a shunting capacitor, and
   wherein the at least one capacitive coupling arrangement further comprises a first capacitor connected between the first gate node and the shunting capacitor, and a second capacitor connected between the second gate node and the shunting capacitor.

10. The differential radio frequency (RF) cascode amplification circuit of claim 9, wherein:
    the first capacitor and the second capacitor are series-connected capacitors of a same capacitance.

11. The differential radio frequency (RF) cascode amplification circuit of claim 10, wherein:
    a capacitance of the shunting capacitor is configured to attenuate a peak to peak voltage at an intermediate gate node that is common to the shunting capacitor, the first capacitor and the second capacitor.

12. The differential radio frequency (RF) cascode amplification circuit of claim 10, wherein:
    a capacitance of the shunting capacitor is in range from about two times to about ten times the capacitance of the first capacitor.

13. The differential radio frequency (RF) cascode amplification circuit of claim 10, wherein:
a capacitance of the shunting capacitor is about five times the capacitance of the first capacitor.

14. The differential radio frequency (RF) cascode amplification circuit of claim 10, wherein:
the same capacitance is configured to provide, at a frequency of operation of the differential RF input signal, respective non-zero impedances coupled to the first and second gate nodes.

15. The differential radio frequency (RF) cascode amplification circuit of claim 14, wherein the respective non-zero impedances allow
the first gate node to float with respect to an RF signal coupled to the first cascode transistor that is based on the first input RF signal, and
the second gate node to float with respect to an RF signal coupled to the second cascode transistor that is based on the second input RF signal.

16. The differential radio frequency (RF) cascode amplification circuit of claim 14, wherein the respective non-zero impedances provide a distribution of RF voltages output by respective first and second cascode amplification legs across respective transistors of said amplification legs.

17. The differential radio frequency (RF) cascode amplification circuit of claim 16, wherein said distribution is such that a drain-to-source voltage across each transistor of a respective amplification leg is about equal.

18. A differential radio frequency (RF) cascode amplification circuit comprising:
a first cascode amplification leg comprising a first input transistor and a first group of cascode transistors including a first output transistor, wherein the first cascode amplification leg is configured to amplify a first input RF signal of a differential RF input signal;
a second cascode amplification leg comprising a second input transistor and a second group of cascode transistors including a second output transistor, wherein the second cascode amplification leg is configured to amplify a second input RF signal of the differential RF input signal; and
at least one capacitive coupling arrangement coupled between a first gate node of a first cascode transistor of the first group of cascode transistors and a second gate node of a second cascode transistor of the second group of cascode transistors,
wherein the at least one capacitive coupling arrangement comprises a shunting capacitor and;
wherein the at least one capacitive coupling arrangement comprises a plurality of capacitive coupling arrangements each connected between symmetrical node pairs formed by gate nodes of the first and second groups of cascode transistors.

19. The differential radio frequency (RF) cascode amplification circuit of claim 18, wherein:
each of the plurality of capacitive coupling arrangements is configured to provide, at a frequency of operation of the differential RF input signal, respective non-zero impedances at respective first and second gate nodes of the symmetrical node pairs.

20. The differential radio frequency (RF) cascode amplification circuit of claim 19, wherein:
the respective non-zero impedances are configured to allow said gate nodes to float with respect to an RF signal coupled to the first and second groups of cascode transistors.

21. A method for reducing gate node parasitic inductance in a differential radio frequency (RF) cascode amplification circuit, the method comprising:
providing a differential RF cascode amplification circuit comprising symmetrical node pairs of first and second cascode amplification legs;
coupling a capacitive coupling arrangement between a first gate node of a cascode transistor of the first cascode amplification leg and a second gate node of a cascode transistor of the second cascode amplification leg, the capacitive coupling arrangement comprising a shunting capacitor;
based on the coupling, creating an AC reference voltage at an intermediate gate node provided by the shunting capacitor;
based on the coupling and the creating, capacitively coupling via respective first and second capacitors the first and second gate nodes to the intermediate gate node, thereby eliminating a physical ground connection to the first and second capacitors; and
based on the eliminating, reducing parasitic inductance at the first and second gate nodes.

* * * * *